US009729251B2

(12) United States Patent
Cox et al.

(10) Patent No.: US 9,729,251 B2
(45) Date of Patent: *Aug. 8, 2017

(54) COOLING SYSTEM CONTROL IN DISTRIBUTED ANTENNA SYSTEMS

(71) Applicant: Corning Optical Communications LLC, Hickory, NC (US)

(72) Inventors: Terry Dean Cox, Fort Worth, TX (US); Ami Hazani, Ra'anana (IL)

(73) Assignee: Corning Optical Communications LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/845,929

(22) Filed: Sep. 4, 2015

(65) Prior Publication Data

US 2015/0381289 A1 Dec. 31, 2015

Related U.S. Application Data

(63) Continuation of application No. 13/950,397, filed on Jul. 25, 2013, now Pat. No. 9,154,222.

(Continued)

(51) Int. Cl.
*G08B 21/00* (2006.01)
*H04B 10/80* (2013.01)
(Continued)

(52) U.S. Cl.
CPC ......... *H04B 10/808* (2013.01); *G06F 1/206* (2013.01); *H02H 7/093* (2013.01); *H04B 10/07* (2013.01);
(Continued)

(58) Field of Classification Search
CPC ... H04B 10/07; H04B 10/25753; G06F 1/206; H02H 7/093; H02H 3/04; H05K 7/20209; H05K 7/2019
(Continued)

(56) References Cited

U.S. PATENT DOCUMENTS 4,449,246 A 5/1984 Seiler et al.
4,665,560 A 5/1987 Lange
(Continued)

FOREIGN PATENT DOCUMENTS

CN 1764123 4/2006
CN 101030162 A 9/2007
(Continued)

OTHER PUBLICATIONS

International Search Report and Written Opinion for PCT/IL2015/050656, mailed Oct. 8, 2015, 9 pages.
(Continued)

*Primary Examiner* — John A Tweel, Jr.
(74) *Attorney, Agent, or Firm* — C. Keith Montgomery

(57) ABSTRACT

Power distribution modules in distributed antenna systems include fan monitoring circuits for indicating an alarm condition to head-end equipment. The alarm condition can be used by system operator/owners that a fan is drawing excessive power, thereby detracting from system performance, or indicating that the fan may fail. The alarm condition signal can be returned to the head-end equipment via an uplink communication path between a remote unit powered by the module and the head-end equipment.

13 Claims, 11 Drawing Sheets

Related U.S. Application Data

(60) Provisional application No. 61/677,741, filed on Jul. 31, 2012.

(51) Int. Cl.
  *H04B 10/07* (2013.01)
  *H02H 7/093* (2006.01)
  *H05K 7/20* (2006.01)
  *G06F 1/20* (2006.01)
  *H04B 10/2575* (2013.01)
  *H04W 88/08* (2009.01)

(52) U.S. Cl.
  CPC ..... *H04B 10/25753* (2013.01); *H05K 7/2019* (2013.01); *H05K 7/20209* (2013.01); *H04W 88/085* (2013.01)

(58) Field of Classification Search
  USPC ........ 340/635, 644, 648, 660, 664; 318/478; 361/24, 79; 455/572
  See application file for complete search history.

(56) References Cited

U.S. PATENT DOCUMENTS

| | | |
|---|---|---|
| 4,939,852 A | 7/1990 | Brenner |
| 4,972,346 A | 11/1990 | Kawano et al. |
| 5,056,109 A | 10/1991 | Gilhousen et al. |
| 5,138,679 A | 8/1992 | Edwards et al. |
| 5,187,803 A | 2/1993 | Sohner et al. |
| 5,206,655 A | 4/1993 | Caille et al. |
| 5,208,812 A | 5/1993 | Dudek et al. |
| 5,278,989 A | 1/1994 | Burke et al. |
| 5,280,472 A | 1/1994 | Gilhousen et al. |
| 5,329,604 A | 7/1994 | Baldwin et al. |
| 5,381,459 A | 1/1995 | Lappington |
| 5,396,224 A | 3/1995 | Dukes et al. |
| 5,420,863 A | 5/1995 | Taketsugu et al. |
| 5,432,838 A | 7/1995 | Purchase et al. |
| 5,436,827 A | 7/1995 | Gunn et al. |
| 5,519,830 A | 5/1996 | Opoczynski |
| 5,534,854 A | 7/1996 | Bradbury et al. |
| 5,559,831 A | 9/1996 | Keith |
| 5,598,314 A | 1/1997 | Hall |
| 5,606,725 A | 2/1997 | Hart |
| 5,668,562 A | 9/1997 | Cutrer et al. |
| 5,682,256 A | 10/1997 | Motley et al. |
| 5,708,681 A | 1/1998 | Malkemes et al. |
| 5,726,984 A | 3/1998 | Kubler et al. |
| 5,765,099 A | 6/1998 | Georges et al. |
| 5,790,536 A | 8/1998 | Mahany et al. |
| 5,802,173 A | 9/1998 | Hamilton-Piercy et al. |
| 5,809,395 A | 9/1998 | Hamilton-Piercy et al. |
| 5,809,431 A | 9/1998 | Bustamante et al. |
| 5,818,883 A | 10/1998 | Smith et al. |
| 5,839,052 A | 11/1998 | Dean et al. |
| 5,862,460 A | 1/1999 | Rich |
| 5,867,763 A | 2/1999 | Dean et al. |
| 5,889,469 A | 3/1999 | Mykytiuk et al. |
| 5,953,670 A | 9/1999 | Newson |
| 5,969,837 A | 10/1999 | Farber et al. |
| 5,983,070 A | 11/1999 | Georges et al. |
| 6,006,069 A | 12/1999 | Langston |
| 6,011,980 A | 1/2000 | Nagano et al. |
| 6,014,546 A | 1/2000 | Georges et al. |
| 6,037,898 A | 3/2000 | Parish et al. |
| 6,060,879 A | 5/2000 | Mussenden |
| 6,069,721 A | 5/2000 | Oh et al. |
| 6,118,767 A | 9/2000 | Shen et al. |
| 6,122,529 A | 9/2000 | Sabat, Jr. et al. |
| 6,125,048 A | 9/2000 | Loughran et al. |
| 6,128,477 A | 10/2000 | Freed |
| 6,157,810 A | 12/2000 | Georges et al. |
| 6,163,266 A | 12/2000 | Fasullo et al. |
| 6,188,876 B1 | 2/2001 | Kim |
| 6,192,216 B1 | 2/2001 | Sabat, Jr. et al. |
| 6,194,968 B1 | 2/2001 | Winslow |
| 6,212,274 B1 | 4/2001 | Ninh |
| 6,212,397 B1 | 4/2001 | Langston et al. |
| 6,222,503 B1 | 4/2001 | Gietema |
| 6,223,201 B1 | 4/2001 | Reznak |
| 6,236,863 B1 | 5/2001 | Waldroup et al. |
| 6,275,990 B1 | 8/2001 | Dapper et al. |
| 6,279,158 B1 | 8/2001 | Geile et al. |
| 6,295,451 B1 | 9/2001 | Mimura |
| 6,307,869 B1 | 10/201 | Pawelski |
| 6,317,599 B1 | 11/2001 | Rappaport et al. |
| 6,330,241 B1 | 12/2001 | Fort |
| 6,330,244 B1 | 12/2001 | Swartz et al. |
| 6,334,219 B1 | 12/2001 | Hill et al. |
| 6,336,021 B1 | 1/2002 | Nukada |
| 6,336,042 B1 | 1/2002 | Dawson et al. |
| 6,340,932 B1 | 1/2002 | Rodgers et al. |
| 6,353,600 B1 | 3/2002 | Schwartz et al. |
| 6,366,774 B1 | 4/2002 | Ketonen et al. |
| 6,370,203 B1 | 4/2002 | Boesch et al. |
| 6,374,124 B1 | 4/2002 | Slabinski |
| 6,389,010 B1 | 5/2002 | Kubler et al. |
| 6,400,318 B1 | 6/2002 | Kasami et al. |
| 6,400,418 B1 | 6/2002 | Wakabayashi |
| 6,405,018 B1 | 6/2002 | Reudink et al. |
| 6,415,132 B1 | 7/2002 | Sabat, Jr. |
| 6,421,327 B1 | 7/2002 | Lundby |
| 6,448,558 B1 | 9/2002 | Greene |
| 6,452,915 B1 | 9/2002 | Jorgensen |
| 6,480,702 B1 | 11/2002 | Sabat, Jr. |
| 6,496,290 B1 | 12/2002 | Lee |
| 6,519,449 B1 | 2/2003 | Zhang et al. |
| 6,535,330 B1 | 3/2003 | Lelic et al. |
| 6,535,720 B1 | 3/2003 | Kintis et al. |
| 6,551,065 B2 | 4/2003 | Lee |
| 6,580,402 B2 | 6/2003 | Navarro et al. |
| 6,580,905 B1 | 6/2003 | Naidu et al. |
| 6,587,514 B1 | 7/2003 | Wright et al. |
| 6,588,943 B1 | 7/2003 | Howard |
| 6,598,009 B2 | 7/2003 | Yang |
| 6,615,074 B2 | 9/2003 | Mickle et al. |
| 6,628,732 B1 | 9/2003 | Takaki |
| 6,657,535 B1 | 12/2003 | Magbie et al. |
| 6,658,269 B1 | 12/2003 | Golemon et al. |
| 6,665,308 B1 | 12/2003 | Rakib et al. |
| 6,670,930 B2 | 12/2003 | Navarro |
| 6,678,509 B2 | 1/2004 | Skarman et al. |
| 6,704,298 B1 | 3/2004 | Matsumiya et al. |
| 6,745,013 B1 | 6/2004 | Porter et al. |
| 6,763,226 B1 | 7/2004 | McZeal, Jr. |
| 6,785,558 B1 | 8/2004 | Stratford et al. |
| 6,801,767 B1 | 10/2004 | Schwartz et al. |
| 6,823,174 B1 | 11/2004 | Masenten et al. |
| 6,826,163 B2 | 11/2004 | Mani et al. |
| 6,836,660 B1 | 12/2004 | Wala |
| 6,836,673 B1 | 12/2004 | Trott |
| 6,842,433 B2 | 1/2005 | West et al. |
| 6,850,510 B2 | 2/2005 | Kubler |
| 6,876,056 B2 | 4/2005 | Tilmans et al. |
| 6,882,311 B2 | 4/2005 | Walker et al. |
| 6,885,344 B2 | 4/2005 | Mohamadi |
| 6,919,858 B2 | 7/2005 | Rofougaran |
| 6,931,659 B1 | 8/2005 | Kinemura |
| 6,934,511 B1 | 8/2005 | Lovinggood et al. |
| 6,934,541 B2 | 8/2005 | Miyatani |
| 6,941,112 B2 | 9/2005 | Hasegawa |
| 6,961,312 B2 | 11/2005 | Kubler et al. |
| 6,977,502 B1 | 12/2005 | Hertz |
| 6,984,073 B2 | 1/2006 | Cox |
| 7,015,826 B1 | 3/2006 | Chan et al. |
| 7,020,488 B1 | 3/2006 | Bleile et al. |
| 7,024,166 B2 | 4/2006 | Wallace |
| 7,039,399 B2 | 5/2006 | Fischer |
| 7,043,271 B1 | 5/2006 | Seto et al. |
| 7,050,017 B2 | 5/2006 | King et al. |
| 7,053,838 B2 | 5/2006 | Judd |
| 7,069,577 B2 | 6/2006 | Geile et al. |
| 7,072,586 B2 | 7/2006 | Aburakawa et al. |

(56) References Cited

U.S. PATENT DOCUMENTS

| | | |
|---|---|---|
| 7,073,953 B2 | 7/2006 | Roth et al. |
| 7,103,119 B2 | 9/2006 | Matsuoka et al. |
| 7,103,377 B2 | 9/2006 | Bauman et al. |
| 7,110,795 B2 | 9/2006 | Doi |
| 7,142,125 B2 | 11/2006 | Larson et al. |
| 7,142,535 B2 | 11/2006 | Kubler et al. |
| 7,142,619 B2 | 11/2006 | Sommer et al. |
| 7,144,255 B2 | 12/2006 | Seymour |
| 7,171,244 B2 | 1/2007 | Bauman |
| 7,177,728 B2 | 2/2007 | Gardner |
| 7,184,728 B2 | 2/2007 | Solum |
| 7,190,748 B2 | 3/2007 | Kim et al. |
| 7,194,023 B2 | 3/2007 | Norrell et al. |
| 7,199,443 B2 | 4/2007 | Elsharawy |
| 7,269,311 B2 | 9/2007 | Kim et al. |
| 7,315,735 B2 | 1/2008 | Graham |
| 7,359,647 B1 | 4/2008 | Faria et al. |
| 7,359,674 B1 | 4/2008 | Markki et al. |
| 7,366,151 B2 | 4/2008 | Kubler et al. |
| 7,369,526 B2 | 5/2008 | Lechleider et al. |
| 7,388,892 B2 | 6/2008 | Nishiyama et al. |
| 7,392,025 B2 | 6/2008 | Rooyen et al. |
| 7,412,224 B2 | 8/2008 | Kotola et al. |
| 7,450,853 B2 | 11/2008 | Kim et al. |
| 7,451,365 B2 | 11/2008 | Wang et al. |
| 7,454,171 B2 | 11/2008 | Palin et al. |
| 7,460,507 B2 | 12/2008 | Kubler et al. |
| 7,469,105 B2 | 12/2008 | Wake et al. |
| 7,483,711 B2 | 1/2009 | Burchfiel |
| 7,486,782 B1 | 2/2009 | Roos |
| 7,505,747 B2 | 3/2009 | Solum |
| 7,512,419 B2 | 3/2009 | Solum |
| 7,515,526 B2 | 4/2009 | Elkayam et al. |
| 7,526,303 B2 | 4/2009 | Chary |
| 7,539,509 B2 | 5/2009 | Bauman et al. |
| 7,542,452 B2 | 6/2009 | Penumetsa |
| 7,546,138 B2 | 6/2009 | Bauman |
| 7,548,138 B2 | 6/2009 | Kamgaing |
| 7,551,641 B2 | 6/2009 | Pirzada et al. |
| 7,557,758 B2 | 7/2009 | Rofougaran |
| 7,567,579 B2 | 7/2009 | Korcharz et al. |
| 7,580,384 B2 | 8/2009 | Kubler et al. |
| 7,585,119 B2 | 9/2009 | Sasaki |
| 7,586,861 B2 | 9/2009 | Kubler et al. |
| 7,587,559 B2 | 9/2009 | Brittain et al. |
| 7,599,420 B2 | 10/2009 | Forenza et al. |
| 7,610,046 B2 | 10/2009 | Wala |
| 7,619,535 B2 | 11/2009 | Chen et al. |
| 7,627,250 B2 | 12/2009 | George et al. |
| 7,630,690 B2 | 12/2009 | Kaewell, Jr. et al. |
| 7,633,934 B2 | 12/2009 | Kubler et al. |
| 7,639,982 B2 | 12/2009 | Wala |
| 7,646,743 B2 | 1/2010 | Kubler et al. |
| 7,646,777 B2 | 1/2010 | Hicks, III et al. |
| 7,653,397 B2 | 1/2010 | Pernu et al. |
| 7,668,565 B2 | 2/2010 | Ylänen et al. |
| 7,688,811 B2 | 3/2010 | Kubler et al. |
| 7,693,486 B2 | 4/2010 | Kasslin et al. |
| 7,697,467 B2 | 4/2010 | Kubler et al. |
| 7,715,375 B2 | 5/2010 | Kubler et al. |
| 7,751,374 B2 | 7/2010 | Donovan |
| 7,751,838 B2 | 7/2010 | Ramesh et al. |
| 7,760,703 B2 | 7/2010 | Kubler et al. |
| 7,768,951 B2 | 8/2010 | Kubler et al. |
| 7,773,573 B2 | 8/2010 | Chung et al. |
| 7,778,603 B2 | 8/2010 | Palin et al. |
| 7,809,012 B2 | 10/2010 | Ruuska et al. |
| 7,812,766 B2 | 10/2010 | Leblanc et al. |
| 7,817,969 B2 | 10/2010 | Castaneda et al. |
| 7,835,328 B2 | 11/2010 | Stephens et al. |
| 7,848,316 B2 | 12/2010 | Kubler et al. |
| 7,848,770 B2 | 12/2010 | Scheinert |
| 7,852,228 B2 | 12/2010 | Teng et al. |
| 7,853,234 B2 | 12/2010 | Afsahi |
| 7,870,321 B2 | 1/2011 | Rofougaran |
| 7,881,755 B1 | 2/2011 | Mishra et al. |
| 7,894,423 B2 | 2/2011 | Kubler et al. |
| 7,899,007 B2 | 3/2011 | Kubler et al. |
| 7,907,972 B2 | 3/2011 | Walton et al. |
| 7,912,043 B2 | 3/2011 | Kubler et al. |
| 7,916,706 B2 | 3/2011 | Kubler et al. |
| 7,917,177 B2 | 3/2011 | Bauman |
| 7,920,553 B2 | 4/2011 | Kubler et al. |
| 7,920,858 B2 | 4/2011 | Sabat, Jr. et al. |
| 7,924,783 B1 | 4/2011 | Mahany et al. |
| 7,936,713 B2 | 5/2011 | Kubler et al. |
| 7,949,364 B2 | 5/2011 | Kasslin et al. |
| 7,957,777 B1 | 6/2011 | Vu et al. |
| 7,962,111 B2 | 6/2011 | Solum |
| 7,969,009 B2 | 6/2011 | Chandrasekaran |
| 7,969,911 B2 | 6/2011 | Mahany et al. |
| 7,970,428 B2 | 6/2011 | Lin et al. |
| 7,990,925 B2 | 8/2011 | Tinnakornsrisuphap et al. |
| 7,996,020 B1 | 8/2011 | Chhabra |
| 8,001,397 B2 | 8/2011 | Hansalia |
| 8,018,907 B2 | 9/2011 | Kubler et al. |
| 8,036,157 B2 | 10/2011 | Hanabusa et al. |
| 8,036,308 B2 | 10/2011 | Rofougaran |
| 8,082,353 B2 | 12/2011 | Huber et al. |
| 8,086,192 B2 | 12/2011 | Rofougaran et al. |
| 8,155,525 B2 | 4/2012 | Cox |
| 8,270,838 B2 | 9/2012 | Cox |
| 8,270,990 B2 | 9/2012 | Zhao |
| 8,306,563 B2 | 11/2012 | Zavadsky et al. |
| 8,328,145 B2 | 12/2012 | Smith |
| 8,406,941 B2 | 3/2013 | Smith |
| 8,417,979 B2 | 4/2013 | Maroney |
| 8,457,562 B2 | 6/2013 | Zavadsky et al. |
| 8,514,092 B2 | 8/2013 | Cao et al. |
| 8,532,492 B2 | 9/2013 | Palanisamy et al. |
| 8,548,330 B2 | 10/2013 | Berlin et al. |
| 8,588,614 B2 | 11/2013 | Larsen |
| 8,620,375 B2 | 12/2013 | Kim et al. |
| 8,622,632 B2 | 1/2014 | Isenhour et al. |
| 8,649,684 B2 | 2/2014 | Casterline et al. |
| 8,744,390 B2 | 6/2014 | Stratford |
| 8,830,035 B2 | 9/2014 | Lindley et al. |
| 8,831,428 B2 | 9/2014 | Kobyakov et al. |
| 8,831,593 B2 | 9/2014 | Melester et al. |
| 8,855,832 B2 | 10/2014 | Rees |
| 8,930,736 B2 | 1/2015 | James |
| 8,971,903 B2 | 3/2015 | Hossain et al. |
| 8,994,276 B2 | 3/2015 | Recker et al. |
| 9,026,036 B2 | 5/2015 | Saban et al. |
| 9,154,222 B2 * | 10/2015 | Cox ................ H04B 10/07 |
| 9,160,449 B2 | 10/2015 | Heidler et al. |
| 9,166,690 B2 | 10/2015 | Brower et al. |
| 9,223,336 B2 | 12/2015 | Petersen et al. |
| 9,343,797 B2 | 5/2016 | Shoemaker et al. |
| 2001/0036199 A1 | 11/2001 | Terry |
| 2002/0051434 A1 | 5/2002 | Ozluturk et al. |
| 2002/0097031 A1 | 7/2002 | Cook et al. |
| 2002/0123365 A1 | 9/2002 | Thorson et al. |
| 2002/0180554 A1 | 12/2002 | Clark et al. |
| 2003/0111909 A1 | 6/2003 | Liu et al. |
| 2003/0146765 A1 | 8/2003 | Darshan et al. |
| 2003/0147353 A1 | 8/2003 | Clarkson et al. |
| 2004/0095907 A1 | 5/2004 | Agee et al. |
| 2004/0146020 A1 | 7/2004 | Kubler et al. |
| 2004/0151164 A1 | 8/2004 | Kubler et al. |
| 2004/0160912 A1 | 8/2004 | Kubler et al. |
| 2004/0160913 A1 | 8/2004 | Kubler et al. |
| 2004/0165573 A1 | 8/2004 | Kubler et al. |
| 2004/0203704 A1 | 10/2004 | Ommodt et al. |
| 2004/0230846 A1 | 11/2004 | Mancey et al. |
| 2005/0047030 A1 | 3/2005 | Lee |
| 2005/0147071 A1 | 7/2005 | Karaoguz et al. |
| 2005/0197094 A1 | 9/2005 | Darshan et al. |
| 2005/0226625 A1 | 10/2005 | Wake et al. |
| 2005/0262364 A1 | 11/2005 | Diab et al. |
| 2005/0272439 A1 | 12/2005 | Picciriello et al. |
| 2006/0053324 A1 | 3/2006 | Giat et al. |
| 2006/0084379 A1 | 4/2006 | O'Neill |
| 2006/0192434 A1 | 8/2006 | Vrla et al. |

(56) References Cited

U.S. PATENT DOCUMENTS

| | | |
|---|---|---|
| 2006/0274704 A1 | 12/2006 | Desai et al. |
| 2007/0004467 A1 | 1/2007 | Chary |
| 2007/0058332 A1 | 3/2007 | Canterbury et al. |
| 2007/0060045 A1 | 3/2007 | Prautzsch |
| 2007/0060055 A1 | 3/2007 | Desai et al. |
| 2007/0076649 A1 | 4/2007 | Lin et al. |
| 2007/0166050 A1 | 7/2007 | Horio et al. |
| 2007/0224954 A1 | 9/2007 | Gopi |
| 2007/0286599 A1 | 12/2007 | Sauer et al. |
| 2007/0291732 A1 | 12/2007 | Todd et al. |
| 2007/0297005 A1 | 12/2007 | Montierth et al. |
| 2008/0002614 A1 | 1/2008 | Hanabusa et al. |
| 2008/0043714 A1 | 2/2008 | Pernu |
| 2008/0044186 A1 | 2/2008 | George et al. |
| 2008/0045271 A1 | 2/2008 | Azuma |
| 2008/0070502 A1 | 3/2008 | George et al. |
| 2008/0080863 A1 | 4/2008 | Sauer et al. |
| 2008/0098203 A1 | 4/2008 | Master et al. |
| 2008/0118014 A1 | 5/2008 | Reunamaki et al. |
| 2008/0129634 A1 | 6/2008 | Pera et al. |
| 2008/0134194 A1 | 6/2008 | Liu |
| 2008/0164890 A1 | 7/2008 | Admon et al. |
| 2008/0166094 A1 | 7/2008 | Bookbinder et al. |
| 2008/0167931 A1 | 7/2008 | Gerstemeier et al. |
| 2008/0186143 A1 | 8/2008 | George et al. |
| 2008/0207253 A1 | 8/2008 | Jaakkola et al. |
| 2008/0251071 A1 | 10/2008 | Armitstead et al. |
| 2008/0252307 A1 | 10/2008 | Schindler |
| 2008/0253351 A1 | 10/2008 | Pernu et al. |
| 2008/0261656 A1 | 10/2008 | Bella et al. |
| 2008/0268833 A1 | 10/2008 | Huang et al. |
| 2008/0272725 A1 | 11/2008 | Bojrup et al. |
| 2008/0279137 A1 | 11/2008 | Pernu et al. |
| 2008/0280569 A1 | 11/2008 | Hazani et al. |
| 2008/0291830 A1 | 11/2008 | Pernu et al. |
| 2008/0292322 A1 | 11/2008 | Daghighian et al. |
| 2009/0007192 A1 | 1/2009 | Singh |
| 2009/0022304 A1 | 1/2009 | Kubler et al. |
| 2009/0028087 A1 | 1/2009 | Nguyen et al. |
| 2009/0028317 A1 | 1/2009 | Ling et al. |
| 2009/0040027 A1 | 2/2009 | Nakao |
| 2009/0055672 A1 | 2/2009 | Burkland et al. |
| 2009/0059903 A1 | 3/2009 | Kubler et al. |
| 2009/0061796 A1 | 3/2009 | Arkko et al. |
| 2009/0073916 A1 | 3/2009 | Zhang et al. |
| 2009/0100275 A1 | 4/2009 | Chang et al. |
| 2009/0121548 A1 | 5/2009 | Schindler et al. |
| 2009/0149221 A1 | 6/2009 | Liu et al. |
| 2009/0169163 A1 | 7/2009 | Abbott, III et al. |
| 2009/0175214 A1 | 7/2009 | Sfar et al. |
| 2009/0218407 A1 | 9/2009 | Rofougaran |
| 2009/0218657 A1 | 9/2009 | Rofougaran |
| 2009/0245084 A1 | 10/2009 | Moffatt et al. |
| 2009/0245153 A1 | 10/2009 | Li et al. |
| 2009/0245221 A1 | 10/2009 | Piipponen |
| 2009/0252136 A1 | 10/2009 | Mahany et al. |
| 2009/0252205 A1 | 10/2009 | Rheinfelder et al. |
| 2009/0258652 A1 | 10/2009 | Lambert et al. |
| 2009/0280854 A1 | 11/2009 | Khan et al. |
| 2009/0285147 A1 | 11/2009 | Subasic et al. |
| 2010/0002626 A1 | 1/2010 | Schmidt et al. |
| 2010/0027443 A1 | 2/2010 | LoGalbo et al. |
| 2010/0054746 A1 | 3/2010 | Logan |
| 2010/0056184 A1 | 3/2010 | Vakil et al. |
| 2010/0056200 A1 | 3/2010 | Tolonen |
| 2010/0080154 A1 | 4/2010 | Noh et al. |
| 2010/0080182 A1 | 4/2010 | Kubler et al. |
| 2010/0091475 A1 | 4/2010 | Toms et al. |
| 2010/0118864 A1 | 5/2010 | Kubler et al. |
| 2010/0127937 A1 | 5/2010 | Chandrasekaran et al. |
| 2010/0134257 A1 | 6/2010 | Puleston et al. |
| 2010/0148373 A1 | 6/2010 | Chandrasekaran |
| 2010/0156721 A1 | 6/2010 | Alamouti et al. |
| 2010/0188998 A1 | 7/2010 | Pernu et al. |
| 2010/0190509 A1 | 7/2010 | Davis |
| 2010/0202326 A1 | 8/2010 | Rofougaran et al. |
| 2010/0225413 A1 | 9/2010 | Rofougaran et al. |
| 2010/0225556 A1 | 9/2010 | Rofougaran et al. |
| 2010/0225557 A1 | 9/2010 | Rofougaran et al. |
| 2010/0232323 A1 | 9/2010 | Kubler et al. |
| 2010/0240302 A1 | 9/2010 | Buczkiewicz et al. |
| 2010/0246558 A1 | 9/2010 | Harel |
| 2010/0255774 A1 | 10/2010 | Kenington |
| 2010/0258949 A1 | 10/2010 | Henderson et al. |
| 2010/0260063 A1 | 10/2010 | Kubler et al. |
| 2010/0290355 A1 | 11/2010 | Roy et al. |
| 2010/0290787 A1 | 11/2010 | Cox |
| 2010/0309049 A1 | 12/2010 | Reunamäki et al. |
| 2010/0311472 A1 | 12/2010 | Rofougaran et al. |
| 2010/0311480 A1 | 12/2010 | Raines et al. |
| 2010/0322206 A1 | 12/2010 | Hole et al. |
| 2010/0329161 A1 | 12/2010 | Ylanen et al. |
| 2010/0329166 A1 | 12/2010 | Mahany et al. |
| 2011/0007724 A1 | 1/2011 | Mahany et al. |
| 2011/0007733 A1 | 1/2011 | Kubler et al. |
| 2011/0021146 A1 | 1/2011 | Pernu |
| 2011/0021224 A1 | 1/2011 | Koskinen et al. |
| 2011/0055861 A1 | 3/2011 | Covell et al. |
| 2011/0065450 A1 | 3/2011 | Kazmi |
| 2011/0069668 A1 | 3/2011 | Chion et al. |
| 2011/0071734 A1 | 3/2011 | Van Wiemeersch et al. |
| 2011/0086614 A1 | 4/2011 | Brisebois et al. |
| 2011/0105110 A1 | 5/2011 | Carmon et al. |
| 2011/0116572 A1 | 5/2011 | Lee et al. |
| 2011/0126071 A1 | 5/2011 | Han et al. |
| 2011/0149879 A1 | 6/2011 | Noriega et al. |
| 2011/0158298 A1 | 6/2011 | Djadi et al. |
| 2011/0172841 A1 | 7/2011 | Forbes, Jr. |
| 2011/0182230 A1 | 7/2011 | Ohm et al. |
| 2011/0194475 A1 | 8/2011 | Kim et al. |
| 2011/0201368 A1 | 8/2011 | Faccin et al. |
| 2011/0204504 A1 | 8/2011 | Henderson et al. |
| 2011/0211439 A1 | 9/2011 | Manpuria et al. |
| 2011/0215901 A1 | 9/2011 | Van Wiemeersch et al. |
| 2011/0222415 A1 | 9/2011 | Ramamurthi et al. |
| 2011/0222434 A1 | 9/2011 | Chen |
| 2011/0222619 A1 | 9/2011 | Ramamurthi et al. |
| 2011/0227795 A1 | 9/2011 | Lopez et al. |
| 2011/0241425 A1 | 10/2011 | Hunter, Jr. et al. |
| 2011/0244887 A1 | 10/2011 | Dupray et al. |
| 2011/0249715 A1 | 10/2011 | Choi et al. |
| 2011/0256878 A1 | 10/2011 | Zhu et al. |
| 2011/0260939 A1 | 10/2011 | Korva et al. |
| 2011/0266999 A1 | 11/2011 | Yodfat et al. |
| 2011/0268033 A1 | 11/2011 | Boldi et al. |
| 2011/0268446 A1 | 11/2011 | Cune et al. |
| 2011/0268449 A1 | 11/2011 | Berlin et al. |
| 2011/0268452 A1 | 11/2011 | Beamon et al. |
| 2011/0274021 A1 | 11/2011 | He et al. |
| 2011/0281536 A1 | 11/2011 | Lee et al. |
| 2012/0009926 A1 | 1/2012 | Hevizi et al. |
| 2012/0033676 A1 | 2/2012 | Mundra et al. |
| 2012/0063377 A1 | 3/2012 | Osterling et al. |
| 2012/0099448 A1 | 4/2012 | Matsuo et al. |
| 2012/0106442 A1 | 5/2012 | Xiao |
| 2012/0120995 A1 | 5/2012 | Wurth |
| 2012/0122405 A1 | 5/2012 | Gerber et al. |
| 2012/0163829 A1 | 6/2012 | Cox |
| 2012/0196611 A1 | 8/2012 | Venkatraman et al. |
| 2012/0214538 A1 | 8/2012 | Kim et al. |
| 2012/0289224 A1 | 11/2012 | Hallberg et al. |
| 2012/0293390 A1 | 11/2012 | Shoemaker et al. |
| 2012/0307876 A1 | 12/2012 | Trachewsky et al. |
| 2012/0317426 A1 | 12/2012 | Hunter, Jr. et al. |
| 2012/0319916 A1 | 12/2012 | Gears et al. |
| 2013/0017863 A1 | 1/2013 | Kummetz et al. |
| 2013/0035047 A1 | 2/2013 | Chen et al. |
| 2013/0040676 A1 | 2/2013 | Kang et al. |
| 2013/0049469 A1 | 2/2013 | Huff et al. |
| 2013/0094425 A1 | 4/2013 | Soriaga et al. |
| 2013/0102309 A1 | 4/2013 | Chande et al. |
| 2013/0132683 A1 | 5/2013 | Ajanovic et al. |
| 2013/0137411 A1 | 5/2013 | Marin |
| 2013/0188959 A1 | 7/2013 | Cune et al. |

(56) References Cited

U.S. PATENT DOCUMENTS

| | | | |
|---|---|---|---|
| 2013/0225182 A1 | 8/2013 | Singh et al. |
| 2013/0225183 A1 | 8/2013 | Meshkati et al. |
| 2013/0235726 A1 | 9/2013 | Frederiksen et al. |
| 2013/0249292 A1 | 9/2013 | Blackwell, Jr. et al. |
| 2013/0260706 A1 | 10/2013 | Singh |
| 2013/0295980 A1 | 11/2013 | Reuven et al. |
| 2013/0330086 A1 | 12/2013 | Berlin et al. |
| 2013/0337750 A1 | 12/2013 | Ko |
| 2014/0024402 A1 | 1/2014 | Singh |
| 2014/0037294 A1 | 2/2014 | Cox et al. |
| 2014/0050482 A1 | 2/2014 | Berlin et al. |
| 2014/0075217 A1 | 3/2014 | Wong et al. |
| 2014/0087742 A1 | 3/2014 | Brower et al. |
| 2014/0089688 A1 | 3/2014 | Man et al. |
| 2014/0097846 A1 | 4/2014 | Lemaire et al. |
| 2014/0146692 A1 | 5/2014 | Hazani et al. |
| 2014/0148214 A1 | 5/2014 | Sasson |
| 2014/0153919 A1 | 6/2014 | Casterline et al. |
| 2014/0169246 A1 | 6/2014 | Chui et al. |
| 2014/0233442 A1 | 8/2014 | Atias et al. |
| 2014/0293894 A1 | 10/2014 | Saban et al. |
| 2014/0308043 A1 | 10/2014 | Heidler et al. |
| 2014/0308044 A1 | 10/2014 | Heidler et al. |
| 2015/0082066 A1 | 3/2015 | Bose et al. |
| 2015/0098350 A1 | 4/2015 | Mini et al. |
| 2015/0249513 A1 | 9/2015 | Schwab et al. |
| 2015/0380928 A1 | 12/2015 | Saig et al. |
| 2017/0055207 A1 | 2/2017 | Hagage et al. |

FOREIGN PATENT DOCUMENTS

| | | |
|---|---|---|
| CN | 101232179 A | 7/2008 |
| CN | 101803246 A | 8/2010 |
| CN | 101876962 A | 11/2010 |
| EP | 0851618 A2 | 7/1998 |
| EP | 0924881 A2 | 6/1999 |
| EP | 1227605 A2 | 7/2002 |
| EP | 1347584 A2 | 9/2003 |
| EP | 1173034 | 7/2007 |
| EP | 1954019 A1 | 8/2008 |
| GB | 2275834 A | 9/1994 |
| JP | 58055770 A | 4/1983 |
| JP | 2002353813 A | 12/2002 |
| KR | 20040053467 A | 6/2004 |
| KR | 1031619B B1 | 4/2011 |
| WO | 9603823 A1 | 2/1996 |
| WO | 0072475 A1 | 11/2000 |
| WO | 0184760 A1 | 11/2001 |
| WO | 03024027 A1 | 3/2003 |
| WO | 2005117337 A1 | 12/2005 |
| WO | 2006077569 A1 | 7/2006 |
| WO | 2006077570 A1 | 7/2006 |
| WO | 2008083317 A1 | 7/2008 |
| WO | 2009014710 A1 | 1/2009 |
| WO | 2009145789 A1 | 12/2009 |
| WO | 2010090999 A1 | 8/2010 |
| WO | 2010132292 A1 | 11/2010 |
| WO | 2011123314 A1 | 10/2011 |
| WO | 2012051227 A1 | 4/2012 |
| WO | 2012051230 A1 | 4/2012 |
| WO | 2012064333 A1 | 5/2012 |
| WO | 2012071367 A1 | 5/2012 |
| WO | 2012103822 A2 | 8/2012 |
| WO | 2012115843 A1 | 8/2012 |
| WO | 2015049671 A2 | 4/2015 |

OTHER PUBLICATIONS

The Second Office Action for Chinese Patent Application No. 201180059270.4, mailed Jan. 28, 2016, 42 pages.
Final Office Action for U.S. Appl. No. 13/687,457, mailed Feb. 12, 2016, 22 pages.
Notice of Allowance for U.S. Appl. No. 13/771,756, mailed Jan. 29, 2016, 14 pages.
Non-final Office Action for U.S. Appl. No. 14/317,475, mailed Feb. 3, 2016, 12 pages.
Arredondo, Albedo et al., "Techniques for Improving In-Building Radio Coverage Using Fiber-Fed Distributed Antenna Networks," IEEE 46th Vehicular Technology Conference, Atlanta, Georgia, Apr. 28-May 1, 1996, pp. 1540-1543, vol. 3.
Author Unknown, "INT6400/INT1400: HomePlug AV Chip Set," Product Brief, Atheros Powerline Technology, 27003885 Revision 2, Atheros Communications, Inc., 2009, 2 pages.
Author Unknown, "MegaPlug AV: 200 Mbps Ethernet Adapter," Product Specifications, Actiontec Electronics, Inc., 2010, 2 pages.
Cho, Bong Youl et al. "The Forward Link Performance of a PCS System with an AGC," 4th CDMA International Conference and Exhibition,"The Realization of IMT-2000," 1999, 10 pages.
Chu, Ta-Shing et al. "Fiber optic microcellular radio", IEEE Transactions on Vehicular Technology, Aug. 1991, pp. 599-606, vol. 40, Issue 3.
Cutrer, David M. et al., "Dynamic Range Requirements for Optical Transmitters in Fiber-Fed Microcellular Networks," IEEE Photonics Technology Letters, May 1995, pp. 564-566, vol. 7, No. 5.
Dolmans, G. et al. "Performance study of an adaptive dual antenna handset for indoor communications", IEE Proceedings: Microwaves, Antennas and Propagation, Apr. 1999, pp. 138-144, vol. 146, Issue 2.
Ellinger, Frank et al., "A 5.2 GHz variable gain LNA MMIC for adaptive antenna combining", IEEE MTT-S International Microwave Symposium Digest, Anaheim, California, Jun. 13-19, 1999, pp. 501-504, vol. 2.
Fan, J.C. et al., "Dynamic range requirements for microcellular personal communication systems using analog fiber-optic links", IEEE Transactions on Microwave Theory and Techniques, Aug. 1997, pp. 1390-1397, vol. 45, Issue 8.
Schweber, Bill, "Maintaining cellular connectivity indoors demands sophisticated design," EDN Network, Dec. 21, 2000, 2 pages, http://www.edn.com/design/integrated-circuit-design/4362776/Maintaining-cellular-connectivity-indoors-demands-sophisticated-design.
Windyka, John et al., "System-Level Integrated Circuit (SLIC) Technology Development for Phased Array Antenna Applications," Contractor Report 204132, National Aeronautics and Space Administration, Jul. 1997, 94 pages.
International Preliminary Report on Patentability for PCT/US2011/061761 mailed May 28, 2013, 8 pages.
International Search Report for PCT/US2011/061761 mailed Jan. 26, 2012, 3 pages.
International Search Report for PCT/US2010/056458 mailed Aug. 2, 2011, 4 pages.
International Preliminary Report on Patentability for PCT/US2010/056458 mailed May 23, 2013, 9 pages.
Non-final Office Action for U.S. Appl. No. 13/410,916 mailed Jul. 18, 2012, 13 pages.
Notice of Allowance for U.S. Appl. No. 13/410,916 mailed Aug. 9, 2012, 9 pages.
Author Unknown, "MDS SDx Packaged Stations," Technical Manual, MDS 05-6312A01, Revision B, May 2011, GE MDS, LLC, Rochester, New York, 44 pages.
Author Unknown, "Quad Integrated IEEE 802.3at PSE Controller and Power Management System with up to 30W per Port Capabilities," Product Brief, BCM59103, Broadcom Corporation, Oct. 12, 2009, 2 pages.
Author Unknown, "Quad IEEE 802.3at Power Over Ethernet Controller," Product Brief, LTC4266, Linear Technology Corporation, 2009, 2 pages.
Author Unknown, "Single IEEE 802.3at Power Over Ethernet Controller," Product Brief, LTC4274, Linear Technology Corporation, 2009, 2 pages.
Author Unknown, "TPS23841: High-Power, Wide Voltage Range, Quad-Port Ethernet Power Sourcing Equipment Manager," Texas Instruments Incorporated, Nov. 2006, Revised May 2007, 48 pages.
International Search Report for PCT/US2010/034005 mailed Aug. 12, 2010, 4 pages.
International Preliminary Report on Patentability for PCT/US2010/034005 mailed Nov. 24, 2011, 7 pages.

(56) References Cited

OTHER PUBLICATIONS

International Search Report for PCT/US2011/055858 mailed Feb. 7, 2012, 4 pages.
International Preliminary Report on Patentability for PCT/US2011/055858 mailed Apr. 25, 2013, 8 pages.
International Search Report for PCT/US2011/055861 mailed Feb. 7, 2012, 4 pages.
International Preliminary Report on Patentability for PCT/US2011/055861 mailed Apr. 25, 2013, 9 pages.
International Preliminary Report on Patentability for PCT/US2011/061761 mailed Jun. 6, 2013, 9 pages.
Translation of the the First Office Action for Chinese Patent Application No. 201180059270.4 issued May 13, 2015, 19 pages.
International Search Report for PCT/US2013/058937 mailed Jan. 14, 2014, 4 pages.
International Preliminary Report on Patentability for PCT/US2013/058937 mailed Apr. 9, 2015, 7 pages.
Non-final Office Action for U.S. Appl. No. 13/626,371 mailed Dec. 13, 2013, 15 pages.
Non-final Office Action for U.S. Appl. No. 13/626,371 mailed Jun. 25, 2014, 16 pages.
Notice of Allowance for U.S. Appl. No. 13/626,371 mailed Nov. 25, 2014, 7 pages.
Notice of Allowance for U.S. Appl. No. 13/626,371 mailed Aug. 3, 2015, 7 pages.
Non-final Office Action for U.S. Appl. No. 13/859,985 mailed Feb. 27, 2015, 15 pages.
Final Office Action for U.S. Appl. No. 13/859,985 mailed Jul. 22, 2015, 8 pages.
Final Office Action for U.S. Appl. No. 13/860,017 mailed Jul. 23, 2015, 8 pages.
Non-Final Office Action for U.S. Appl. No. 13/950,397, mailed Mar. 17, 2015, 6 pages.
Notice of Allowance for U.S. Appl. No. 13/950,397, mailed Jun. 10, 2015, 7 pages.
Non-Final Office Action for U.S. Appl. No. 13/771,756 mailed Sep. 10, 2014, 26 pages.
Final Office Action for U.S. Appl. No. 13/771,756 mailed Apr. 30, 2015, 38 pages.
International Search Report for PCT/IL2013/050976, mailed Mar. 18, 2014, 3 pages.
Translation of the First Office Action for Chinese Patent Application No. 201180053270.3 issued May 26, 2015, 17 pages.
Translation of the First Office Action for Chinese Patent Application No. 201180052537.7 issued Jun. 25, 2015, 9 pages.
Non-final Office Action for U.S. Appl. No. 13/687,457 mailed Jul. 30, 2015, 12 pages.
Advisory Action for U.S. Appl. No. 13/771,756, mailed Aug. 21, 2015, 4 pages.
Author Unknown, "Equivalent Circuits—(Thevenin and Norton)," Bucknell Lecture Notes, Wayback Machine, Mar. 25, 2010, http://www.facstaff.bucknell.edu/mastascu/elessonsHTML/Source/Source2.html, 15 pages.
International Search Report and Written Opinion for PCT/IL2014/050766, mailed Nov. 11, 2014, 12 pages.
International Preliminary Report on Patentability for PCT/IL2014/050766, mailed Mar. 10, 2016, 9 pages.
Advisory Action and Applicant-Initiated Interview Summary for U.S. Appl. No. 13/687,457, mailed May 13, 2016 5 pages.
Non-final Office Action for U.S. Appl. No. 13/687,457, mailed Jun. 27, 2016, 30 pages.
Non-final Office Action for U.S. Appl. No. 13/899,118, mailed Jun. 30, 2016, 11 pages.
Final Office Action for U.S. Appl. No. 14/317,475, mailed May 26, 2016, 12 pages.
Notice of Allowance for U.S. Appl. No. 14/317,475, mailed Aug. 5, 2016, 7 pages.
Notice of Allowance for U.S. Appl. No. 14/845,768, mailed Apr. 11, 2016, 8 pages.
Notice of Allowance for U.S. Appl. No. 14/845,946, mailed Jun. 8, 2016, 7 pages.
International Search Report and Written Opinion for PCT/IL2014/051012, mailed Mar. 5, 2015, 11 pages.
Non-final Office Action for U.S. Appl. No. 13/899,118, mailed Jan. 6, 2016, 10 pages.
Non-final Office Action for U.S. Appl. No. 14/845,768, mailed Nov. 19, 2015, 12 pages.
Non-final Office Action for U.S. Appl. No. 14/845,946, mailed Dec. 17, 2015, 11 pages.
International Search Report and Written Opinion for International Patent Application No. PCT/IL2016/050306, mailed Jun. 8, 2016, 14 pages.
Translation of the Fourth Office Action for Chinese Patent Application No. 201180059270.4, mailed Jan. 20, 2017, 6 pages.
Final Office Action for U.S. Appl. No. 13/687,457, mailed Feb. 10, 2017, 33 pages.
Notice of Allowance for U.S. Appl. No. 13/899,118, mailed Jan. 12, 2017, 7 pages.
Non-Final Office Action for U.S. Appl. No. 14/884,317, mailed Feb. 13, 2017, 17 pages.
The Third Office Action for Chinese Patent Application No. 201180059270.4, issued Aug. 23, 2016, 6 pages.
Non-Final Office Action for U.S. Appl. No. 14/845,946, mailed Sep. 9, 2016, 10 pages.
Non-Final Office Action for U.S. Appl. No. 14/884,317, mailed Aug. 31, 2016, 16 pages.
Non-Final Office Action for U.S. Appl. No. 14/853,118, mailed Aug. 12, 2016, 7 pages.
Non-Final Office Action for U.S. Appl. No. 14/961,098, mailed Nov. 14, 2016, 10 pages.
Advisory Action for U.S. Appl. No. 13/687,457, dated May 24, 2017, 7 pages.
Notice of Allowance and Examiner-Initiated Interview Summary for U.S. Appl. No. 14/845,946, dated Apr. 20, 2017, 10 pages.
Non-Final Office Action for U.S. Appl. No. 15/156,556, dated Apr. 11, 2017, 13 pages.

* cited by examiner

COOLING SYSTEM CONTROL IN DISTRIBUTED ANTENNA SYSTEMS

PRIORITY APPLICATION

This application is a continuation of U.S. application Ser. No. 13/950,397, filed Jul. 25, 2013, which claims the benefit of priority under 35 U.S.C. §119 of U.S. Provisional Application No. 61/677,741, filed on Jul. 31, 2012, the contents of both applications being incorporated herein by reference in their entireties.

RELATED APPLICATIONS

This application is related to PCT Application No. PCT/US11/61761, filed Nov. 22, 2011, to U.S. patent application Ser. No. 12/466,514, filed May 15, 2009, and to U.S. application Ser. No. 13/899,118, filed May 21, 2013, which are incorporated herein by reference in their entireties.

BACKGROUND

Field of the Disclosure

The technology of the disclosure relates to systems and methods for monitoring cooling systems in a distributed antenna system.

Technical Background

Wireless communication is rapidly growing, with increasing demands for high-speed mobile data communication. As an example, so-called "wireless fidelity" or "WiFi" systems and wireless local area networks (WLANs) are being deployed in many different types of areas (e.g., coffee shops, airports, libraries, etc.). Distributed communications or antenna systems communicate with wireless devices called "clients," which must reside within the wireless range or "cell coverage area" in order to communicate with an access point device.

One approach to deploying a distributed antenna system involves the use of radio frequency (RF) antenna coverage areas, also referred to as "antenna coverage areas." Antenna coverage areas can have a radius in the range from a few meters up to twenty meters as an example. One type of distributed antenna system for creating antenna coverage areas, called "Radio-over-Fiber" or "RoF," utilizes RF communications signals sent over optical fibers. Both types of systems can include head-end equipment coupled to a plurality of remote antenna units (RAUs) that each provides antenna coverage areas. The RAUs can each include RF transceivers coupled to an antenna to transmit RF communications signals wirelessly, wherein the RAUs are coupled to the head-end equipment via the communication medium. The RAUs contain power-consuming components, such as the RF transceiver, to transmit and receive RF communications signals and thus require power to operate. Power may be provided to the RAUs from remote power supplies, such as at an IDF (intermediate distribution frame), or interconnect unit (ICU) closet at each floor of the building infrastructure.

Power supplies generate considerable heat, and often fans are used to dissipate the heat generated during operation of the distributed antenna system. However, as cooling fans continue to run, the drag on the fan motor will increase over time. This drag typically results from increased friction in the fan's motor bearings resulting from the limited life of the bearing lubrication. The drag can also be caused by an increase in the fan's static pressure, such as when debris accumulates in the fan filter. As fan drag increases, the fan's controller increases the current to the fan motor to ensure that the fan blades maintain a constant rate of revolution.

No admission is made that any reference cited herein constitutes prior art. Applicant reserves the right to challenge the accuracy and pertinency of any cited documents.

SUMMARY

According to one aspect of the present embodiments, a distributed communication system comprises head-end equipment configured to receive downlink electrical radio frequency (RF) communications services signals and to convert the downlink electrical RF communications services signals into downlink optical RF communications services signals to be communicated over an optical RF communications services downlink, a plurality of remote antenna units, and a plurality of power distribution modules. The power distribution modules comprise a fan, an output power port configured to distribute the output power to at least one of the remote antenna units, and a monitoring circuit. The monitoring circuit is configured to monitor power usage of the fan and to provide an alarm signal to a remote antenna unit when the fan power usage is outside of predetermined operating parameters.

According to another aspect, a distributed communication system comprises head-end equipment configured to receive downlink RF communications services signals and to transmit downlink RF communications services over RF communications services downlinks, a plurality of remote antenna units configured to receive downlink RF communications services signals from the head-end equipment and to transmit uplink RF communications services signals to the head-end equipment, and power distribution modules configured to distribute power to the remote antenna units. The power distribution modules comprise a fan and are configured to monitor fan power and to provide an alarm signal to at least one of the remote antenna units when the fan power usage is outside of predetermined operating parameters. The remote antenna units are configured to transmit a fan alarm condition signal to the head-end equipment in response to receiving an alarm signal.

According to yet another aspect, a method is provided for monitoring a distributed communication system comprising head-end equipment configured to receive downlink RF communications services signals and to transmit downlink RF communications services over at least one RF communications services downlink, a plurality of remote antenna units configured to receive downlink RF communications services signals from the head-end equipment and to transmit uplink RF communications services signals to the head-end equipment, and power distribution modules configured to distribute power to the remote antenna units. The power distribution modules have fans for cooling the modules. The method comprises monitoring a power usage of a fan, providing an alarm signal to a remote antenna unit when fan power usage is outside of predetermined operating parameters, and transmitting a fan alarm condition signal from the remote antenna unit receiving the alarm condition signal to the head-end equipment.

Additional features and advantages are set forth in the detailed description, and in part will be readily apparent to those skilled in the art from the description or recognized by practicing the embodiments as described in the written description and claims hereof, as well as the appended drawings. The foregoing general description and the following detailed description are merely exemplary, and are intended to provide an overview or framework to understand the nature and character of the claims.

The drawings provide further understanding and are incorporated in and constitute a part of this specification. The drawings illustrate embodiments and together with the description explain principles and operation of the embodiments.

DETAILED DESCRIPTION

Embodiments disclosed in the detailed description include power distribution modules having cooling requirements in distributed antenna systems (DASs). In embodiments disclosed herein, the power distribution modules can be installed in and connected to a power unit for providing power to a power-consuming DAS component(s), such as a remote antenna unit(s) (RAU(s)). Main power is provided to the power unit and distributed to power distribution modules in the power unit. Power from the main power is distributed by each of the power distribution modules to any power-consuming DAS components connected to the power distribution modules. The power distribution modules distribute power to the power-consuming DAS components to provide power for DAS components.

Before discussing examples of cooling system monitoring and control in distributed antenna systems (DASs), exemplary distributed antenna systems capable of distributing RF communications signals to distributed or remote antenna units (RAUs) are first described with regard to FIGS. 1-3B. The distributed antenna systems in FIGS. 1-3B can include power units located remotely from RAUs that provide power to the RAUs for operation. The DASs in FIGS. 1-3B discussed below include distribution of radio frequency (RF) communications signals; however, the DASs are not limited to distribution of RF communications signals. Also, while the DASs in FIGS. 1-3B include distribution of communications signals over optical fiber, these DASs are not limited to distribution over optical fiber. Distribution mediums could also include, but are not limited to, coaxial cable, twisted-pair conductors, wireless transmission and reception, and any combination thereof.

Figure 1:
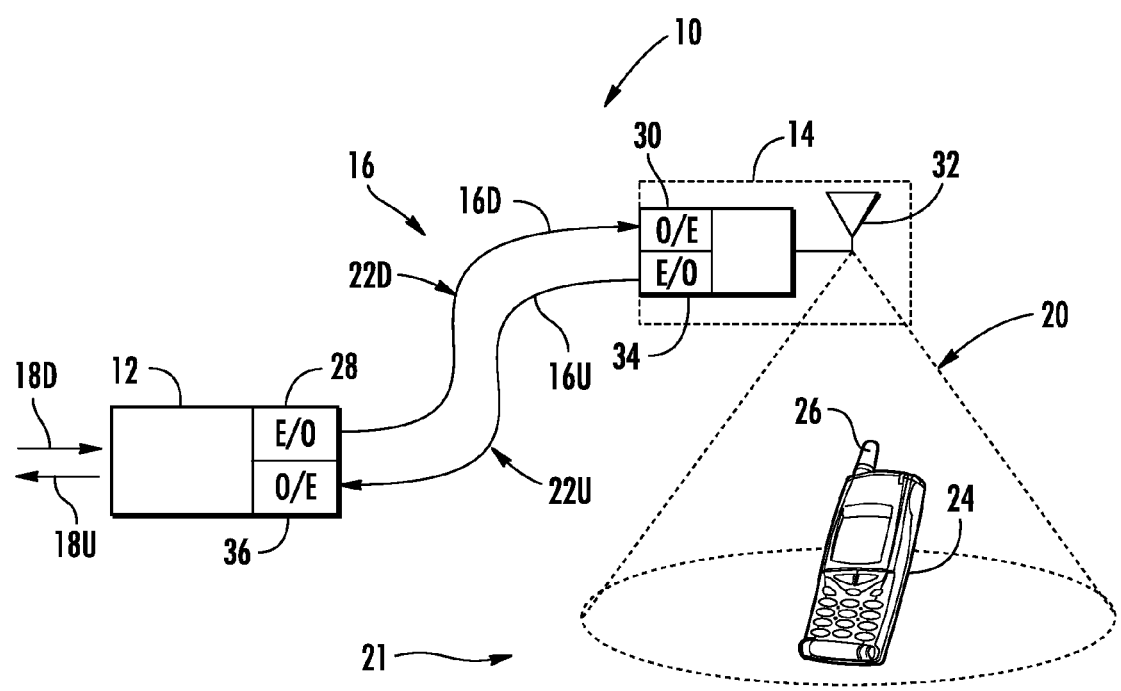
FIG. 1 is a schematic diagram of an exemplary distributed antenna system.

FIG. 1 is a schematic diagram of an embodiment of a distributed antenna system, or distributed communication system. In this embodiment, the DAS is an optical fiber-based distributed antenna system 10. The DAS 10 is configured to create one or more antenna coverage areas for establishing communications with wireless client devices located in the RF range of the antenna coverage areas. The DAS 10 provides RF communication services (e.g., cellular services). In this embodiment, the DAS 10 includes head-end equipment (HEE) 12 such as a head-end unit (HEU), one or more remote antenna units (RAUs) 14, and an optical fiber 16 that optically couples the HEE 12 to the RAU 14. The RAU 14 is a type of remote communications unit. In general, a remote communications unit can support either wireless communications, wired communications, or both. The RAU 14 can support wireless communications and/or wired communications. The HEE 12 is configured to receive communications over downlink electrical RF signals 18D from a source or sources, such as a network or carrier, and provide such communications to the RAU 14. The HEE 12 is also configured to return communications received from the RAU 14, via uplink electrical RF signals 18U, back to the source. In this embodiment, the optical fiber 16 includes at least one downlink optical fiber 16D to carry signals communicated from the HEE 12 to the RAU 14 and at least one uplink optical fiber 16U to carry signals communicated from the RAU 14 back to the HEE 12.

One downlink optical fiber 16D and one uplink optical fiber 16U could be provided to support multiple channels, each using wave-division multiplexing (WDM), as discussed in U.S. patent application Ser. No. 12/892,424, incorporated herein by reference in its entirety. Other options for WDM and frequency-division multiplexing (FDM) are disclosed in U.S. patent application Ser. No. 12/892,424, any of which can be employed in any of the embodiments disclosed herein. Further, U.S. patent application Ser. No. 12/892,424 also discloses distributed digital data communications signals in a DAS which may also be distributed in the optical fiber-based DAS 10 either in conjunction with RF communications signals or not.

The distributed antenna system 10 has an antenna coverage area 20 that can be disposed about the RAU 14. The antenna coverage area 20 of the RAU 14 forms an RF coverage area 21. The HEE 12 is adapted to perform or to facilitate any one of a number of Radio-over-Fiber (RoF) applications, such as RF identification (RFID), wireless local-area network (WLAN) communication, or cellular phone service. Shown within the antenna coverage area 20 is a client device 24 in the form of a cellular telephone. The client device 24 can be any device that is capable of receiving RF communications signals. The client device 24 includes an antenna 26 (e.g., a wireless card) adapted to receive and/or send electromagnetic RF signals. To communicate the electrical RF signals over the downlink optical fiber 16D to the RAU 14, to in turn be communicated to the client device 24 in the antenna coverage area 20 formed by the RAU 14, the HEE 12 includes a radio interface in the form of an electrical-to-optical (E/O) converter 28. The E/O converter 28 converts the downlink electrical RF signals 18D to downlink optical RF signals 22D to be communicated over the downlink optical fiber 16D. The RAU 14 includes an optical-to-electrical (O/E) converter 30 to convert received downlink optical RF signals 22D back to electrical RF signals to be communicated wirelessly through an antenna 32 of the RAU 14 to client devices 24 located in the antenna coverage area 20.

Similarly, the antenna 32 is also configured to receive wireless RF communications from client devices 24 in the antenna coverage area 20. The antenna 32 receives wireless RF communications from client devices 24 and communicates electrical RF signals representing the wireless RF communications to an E/O converter 34 in the RAU 14. The E/O converter 34 converts the electrical RF signals into uplink optical RF signals 22U to be communicated over the uplink optical fiber 16U. An 0/E converter 36 provided in the HEE 12 converts the uplink optical RF signals 22U into uplink electrical RF signals, which can then be communicated as uplink electrical RF signals 18U back to a network or other source.

Figure 2:
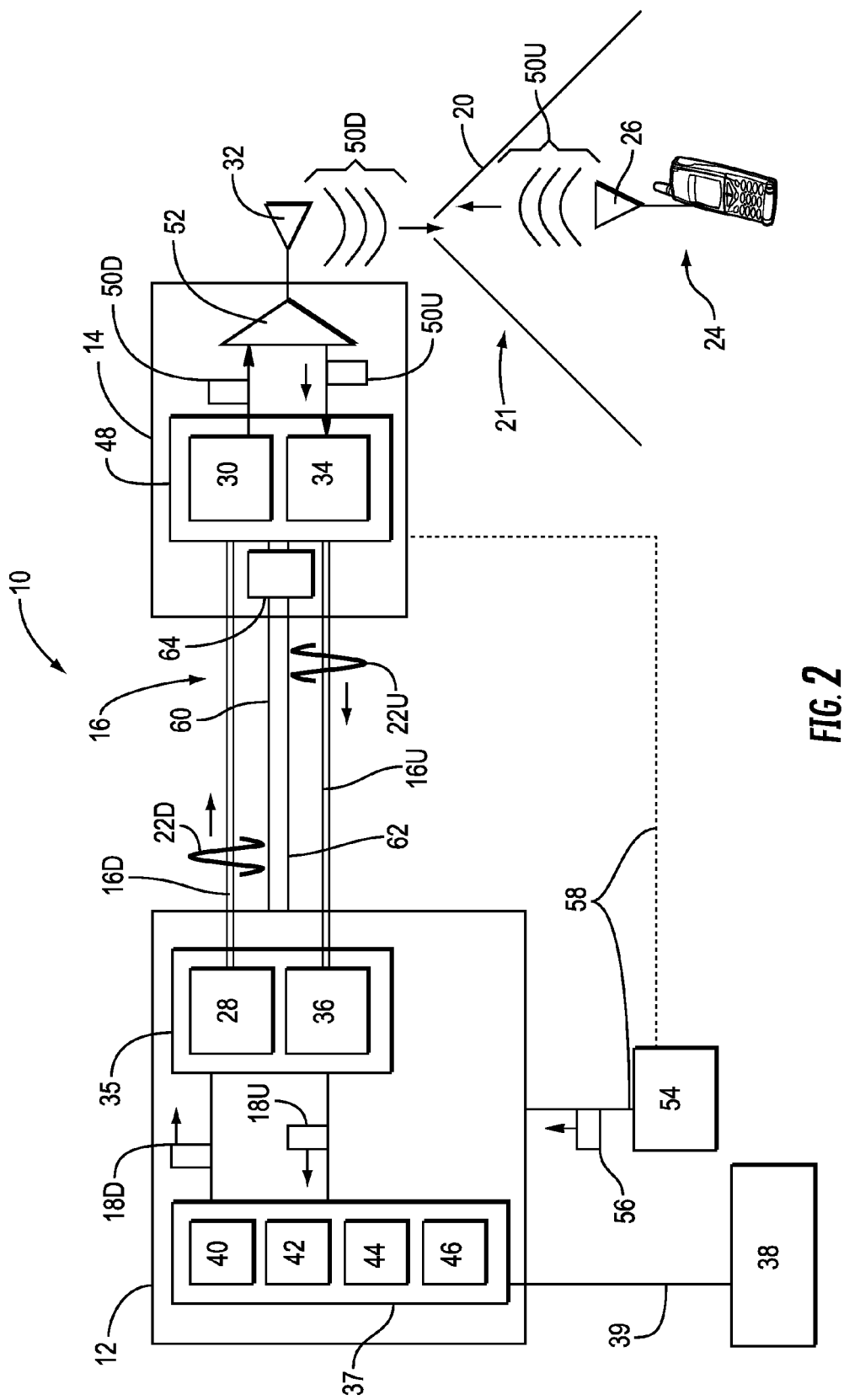
FIG. 2 is a more detailed schematic diagram of head-end equipment and a remote antenna unit (RAU) that can be deployed in the distributed antenna system of FIG. 1.

FIG. 2 is a more detailed schematic diagram of the exemplary distributed antenna system 10 of FIG. 1 that provides electrical RF service signals. The HEE 12 includes a service unit 37 that provides electrical RF service signals by passing such signals from one or more outside networks 38 via a network link 39. In one embodiment, this includes providing cellular signal distribution in the frequency range from 400 MegaHertz (MHz) to 2.7 GigaHertz (GHz). In another embodiment, the service unit 37 provides electrical RF service signals by generating the signals directly.

The service unit 37 is electrically coupled to the E/O converter 28 that receives the downlink electrical RF signals 18D from the service unit 37 and converts them to corresponding downlink optical RF signals 22D. The E/O converter 28 includes a laser suitable for delivering sufficient dynamic range for the RoF applications described herein, and optionally includes a laser driver/amplifier electrically coupled to the laser. The HEE 12 also includes the O/E converter 36, which is electrically coupled to the service unit 37. The O/E converter 36 receives the uplink optical RF signals 22U and converts them to corresponding uplink electrical RF signals 18U. The E/O converter 28 and the O/E converter 36 constitute a "converter pair" 35, as illustrated in FIG. 2.

The service unit 37 in the HEE 12 can include an RF signal conditioner unit 40 for conditioning the downlink electrical RF signals 18D and the uplink electrical RF signals 18U, respectively. The service unit 37 can include a digital signal processing unit 42 for providing to the RF signal conditioner unit 40 an electrical signal that is modulated onto an RF carrier to generate a desired downlink electrical RF signal 18D. The digital signal processor 42 is also configured to process a demodulation signal provided by the demodulation of the uplink electrical RF signal 18U by the RF signal conditioner unit 40. The HEE 12 can also include a central processing unit (CPU) 44 for processing data and otherwise performing logic and computing operations, and a memory unit 46 for storing data, such as data to be transmitted over a WLAN or other network.

The RAU 14 also includes a converter pair 48 comprising the O/E converter 30 and the E/O converter 34. The O/E converter 30 converts the received downlink optical RF signals 22D from the HEE 12 back into downlink electrical RF signals 50D. The E/O converter 34 converts uplink electrical RF signals 50U received from the client device 24 into the uplink optical RF signals 22U to be communicated to the HEE 12. The O/E converter 30 and the E/O converter 34 are electrically coupled to the antenna 32 via an RF signal-directing element 52. The RF signal-directing element 52 directs the downlink electrical RF signals 50D and the uplink electrical RF signals 50U, as discussed below.

The DAS 10 also includes a power system 54 that includes a power supply and provides an electrical power signal 56. The power system 54 is electrically coupled to the HEE 12 for powering the power-consuming elements therein. In one embodiment, an electrical power line 58 runs through the HEE 12 and over to the RAU 14 to power the O/E converter 30 and the E/O converter 34 in the converter pair 48, the optional RF signal-directing element 52 (unless the RF signal-directing element 52 is a passive device such as a circulator for example), and any other power-consuming elements in the DAS. The electrical power line 58 includes two wires 60 and 62 that carry a voltage, and are electrically coupled to a DC power converter 64 at the RAU 14. The DC power converter 64 is electrically coupled to the O/E converter 30 and the E/O converter 34 in the converter pair 48, and changes the voltage or levels of the electrical power signal 56 to the power level(s) required by the power-consuming components in the RAU 14. The DC power converter 64 is either a DC/DC power converter or an AC/DC power converter, depending on the type of electrical power signal 56 carried by the electrical power line 58. In another example embodiment, the electrical power line 58 (dashed line) runs directly from the power system 54 to the RAU 14 rather than from or through the HEE 12.

Figure 3A:
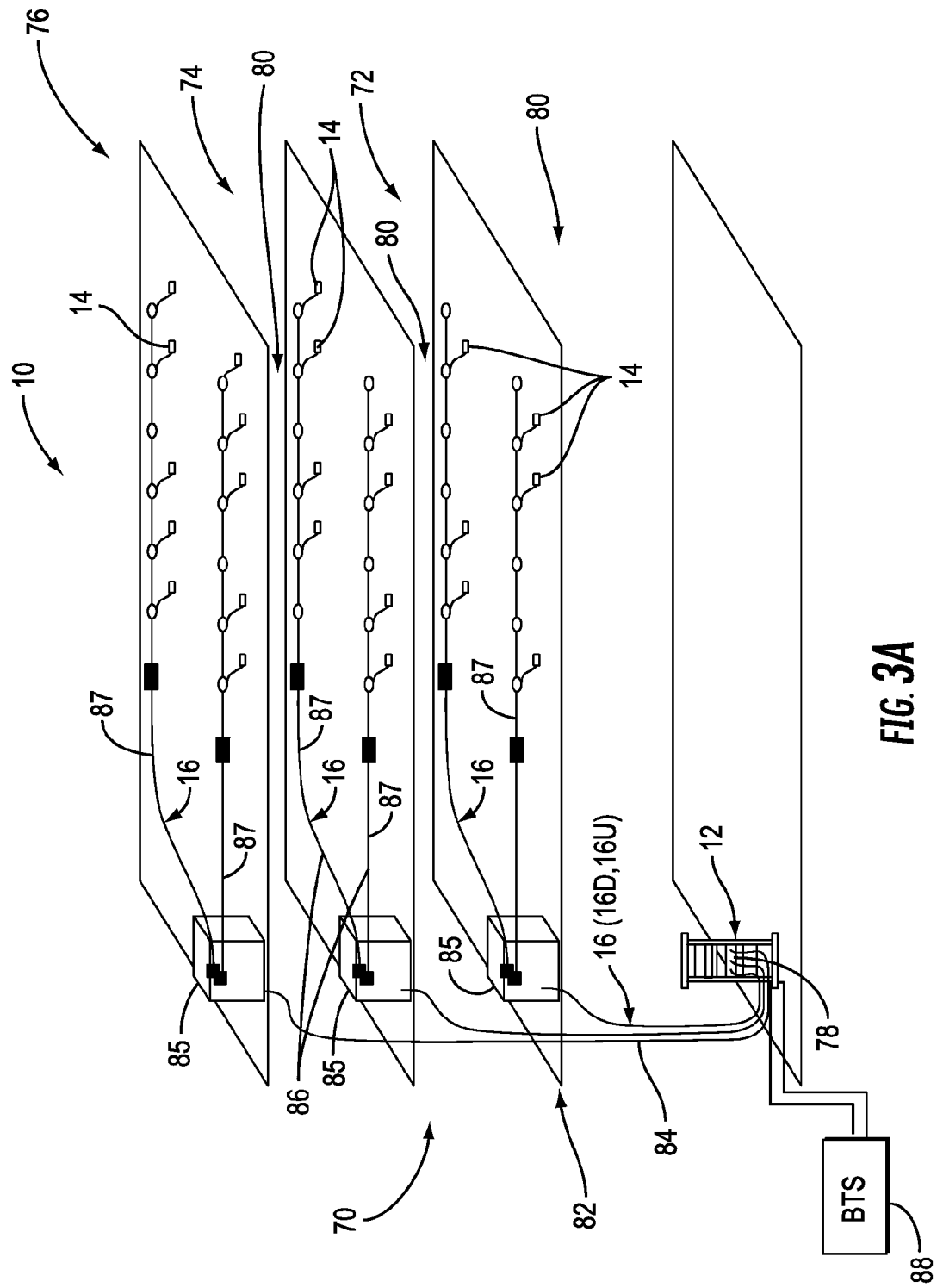
FIG. 3A is a partially schematic cut-away diagram of an exemplary building infrastructure in which the distributed antenna system in FIG. 1 can be employed.

To provide further illustration of how a DAS can be deployed indoors, FIG. 3A illustrates a partially schematic cut-away diagram of a building infrastructure 70 employing an optical fiber-based DAS. The system may be the system 10 of FIGS. 1 and 2. The building infrastructure 70 generally represents any type of building in which the system 10 can be deployed. As previously discussed with regard to FIGS. 1 and 2, the system 10 incorporates the HEE 12 to provide various types of communication services to coverage areas within the building infrastructure 70.

The building infrastructure 70 includes a first (ground) floor 72, a second floor 74, and a third floor 76. The floors 72, 74, 76 are serviced by the HEE 12 through a main distribution frame 78 to provide antenna coverage areas 80 in the building infrastructure 70. Only the ceilings of the floors 72, 74, 76 are shown in FIG. 3A for simplicity of illustration. In the example embodiment, a main cable 82 has a number of different sections that facilitate the placement of a large number of RAUs 14 in the building infrastructure 70. Each RAU 14 in turn services its own coverage area in the antenna coverage areas 80. The main cable 82 can include a riser cable 84 that carries all of the downlink and uplink optical fibers 16D, 16U to and from the HEE 12.

Figure 3B:
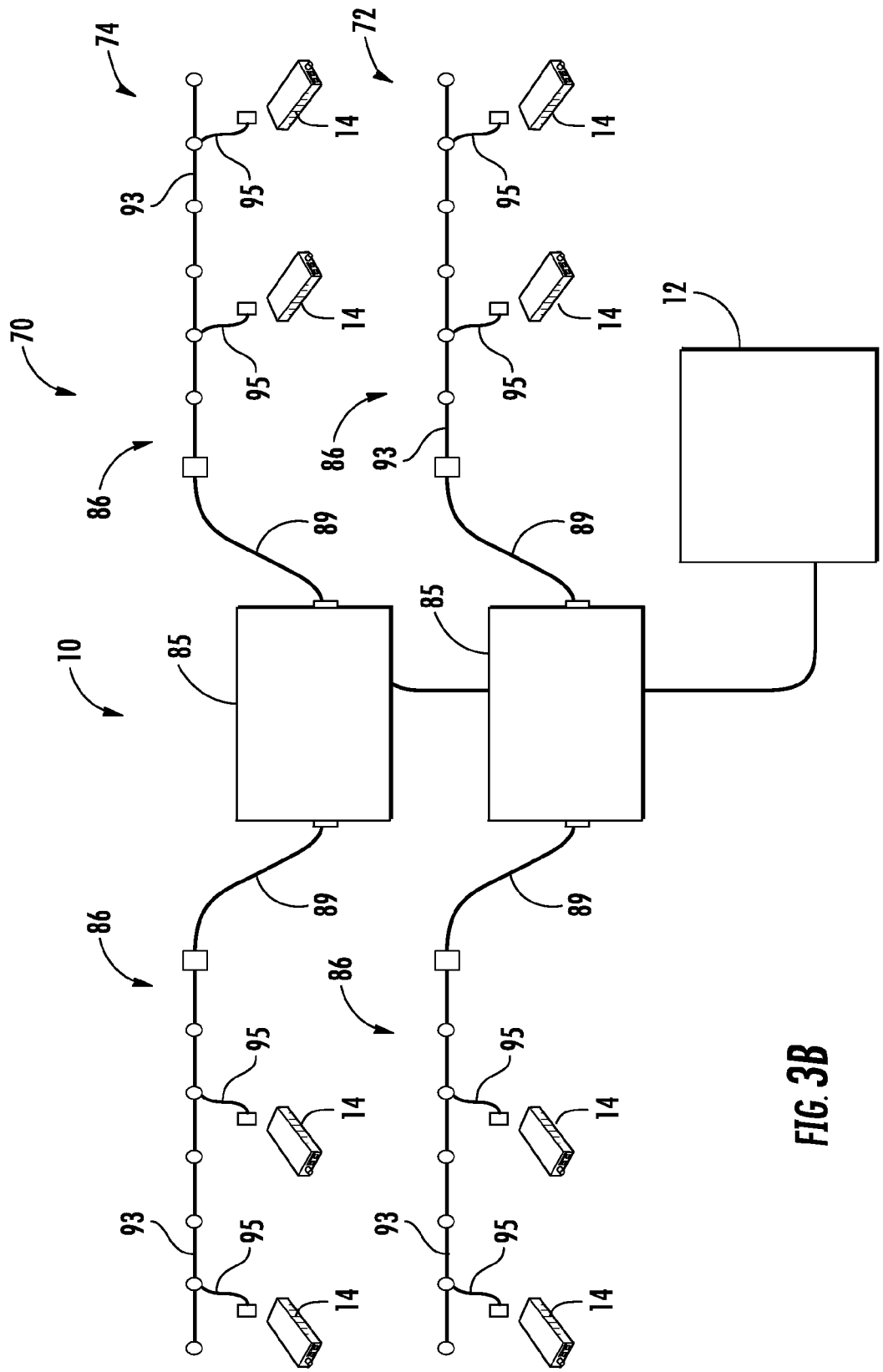
FIG. 3B is an alternative diagram of the distributed antenna system in FIG. 3A.

The riser cable 84 may be routed through a power unit 85. The power unit 85 may be provided as part of or separate from the power system 54 in FIG. 2. The power unit 85 may also be configured to provide power to the RAUs 14 via the electrical power line 58, as illustrated in FIG. 2 and discussed above, provided inside an array cable 87, or tail cable or home-run tether cable as other examples, and distributed with the downlink and uplink optical fibers 16D, 16U to the RAUs 14. For example, as illustrated in the building infrastructure 70 in FIG. 3B, a tail cable 89 may extend from the power units 85 into an array cable 93. Downlink and uplink optical fibers in tether cables 95 of the array cables 93 are routed to each of the RAUs 14, as illustrated in FIG. 3B. The main cable 82 can include one or more multi-cable (MC) connectors adapted to connect select downlink and uplink optical fibers 16D, 16U, along with an electrical power line, to a number of optical fiber cables 86.

The main cable 82 enables multiple optical fiber cables 86 to be distributed throughout the building infrastructure 70 (e.g., fixed to the ceilings or other support surfaces of each floor 72, 74, 76) to provide the antenna coverage areas 80 for the first, second, and third floors 72, 74, and 76. The HEE 12 may be located within the building infrastructure 70 (e.g., in a closet or control room), or located outside of the building infrastructure 70 at a remote location. A base transceiver station (BTS) 88, which may be provided by a second party such as a cellular service provider, is connected to the HEE 12. A BTS is any station or signal source that provides an input signal to the HEE 12 and can receive a return signal from the HEE 12. In a typical cellular system, for example, a plurality of BTSs are deployed at a plurality of remote locations to provide wireless telephone coverage. Each BTS serves a corresponding cell and when a mobile client device enters the cell, the BTS communicates with the mobile client device.

With reference to FIG. 3A, RAUs 14 installed on a given floor 72, 74, or 76 may be serviced from the same optical fiber 16. In this regard, the optical fiber 16 may have multiple nodes where distinct downlink and uplink optical fiber pairs can be connected to a given RAU 14. One downlink optical fiber 16D could be provided to support multiple channels each using wavelength-division multiplexing (WDM), as discussed in U.S. patent application Ser. No. 12/892,424, incorporated herein by reference in its entirety. Other options for WDM and frequency-division multiplexing (FDM) are also disclosed in U.S. patent application Ser. No. 12/892,424, any of which can be employed in any of the embodiments disclosed herein. The HEE 12 may be configured to support any frequencies desired, such as those described in PCT Application No. PCT/US11/617, and the structure and operation of the system can be in accordance with PCT Application No. PCT/US11/617.

Figure 4:
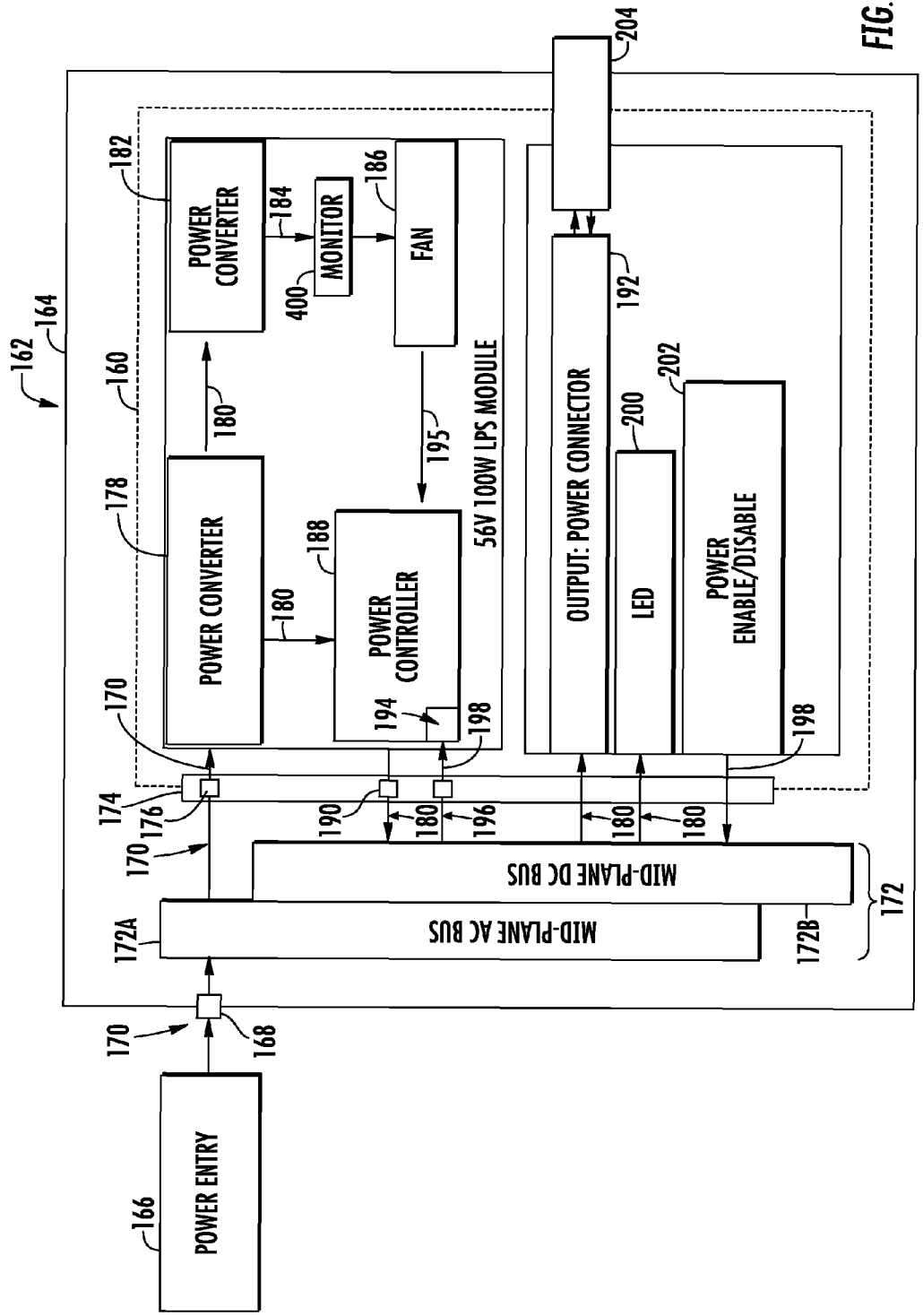
FIG. 4 is a schematic diagram of an exemplary power distribution module.

FIG. 4 is a schematic diagram of an exemplary power distribution module 160 that can be employed to provide power to RAUs or other power-consuming DAS components. In this embodiment, the power distribution module 160 is disposed in a power unit 162. The power unit 162 may serve as the power unit 85 described above to remotely provide power to the RAUs 14. The power unit 162 may be comprised of a chassis 164 or other housing that is configured to support power distribution modules 160. The power unit 162 provides support for receiving power from an external power source 166, which may be AC power, to the power unit 162 to then be distributed within the power unit 162 to the power distribution modules 160 disposed therein. The power unit 162 may be configured to support multiple power distribution modules 162. Each power distribution module 162 may be configured to provide power to multiple RAUs 14. The power unit 162 contains an external input power port 168 disposed in the chassis 164. The external input power port 168 is configured to be electrically coupled to the external power source 166 to supply input power 170 to the external input power connector 168. For example, the external power source 166 may be AC power, and may be either 110 Volts (V) or 220 Volts (V). To distribute the power from the external power source 166 to the power distribution modules 160 disposed in the power unit 162, the power unit 162 contains a midplane interface connector 172. In this embodiment, the midplane interface connector 172 is comprised of an AC connector 172A to carry AC signals, and a DC connector 172B to carry DC signals. The power distribution module 160 contains a complementary connector 174 that can be connected to the midplane interface connector 172 to electrically connect the power distribution module 160 to the power unit 162. For example, the power unit 162 may contain a midplane interface bus that contains a plurality of midplane interface connectors 172 to allow a plurality of power distribution modules 160 to interface with the midplane interface bus.

The power distribution module 160 includes an input power port 176 that is configured to receive input power from the external power source 166. The input power port 176 is provided as part of the connector 174 to allow the source 166 to be electrically coupled to the input power port 176 and thus to the module 160. The module 160 contains an optional power converter 178 to convert the input power 170 from the external power source 166 to DC power 180. The power converter 178 is electrically coupled to the input power port 176 to receive the input power 170 from the external power source 166. The power converter 178 converts the input power 170 from the external power source 166 to output power 180, which is DC power in this example. For example, the power converter 178 may convert the input power 170 to 56 VDC output power 180. A secondary power converter 182 receives the output power 180 and converts the output power 180 to a second output power 184 at a different voltage, such as 12 VDC for example, to provide power to a cooling fan 186 in the module 160. According to one aspect of the present embodiment, a monitoring circuit 400 can be disposed in the electrical power supply path of the cooling fan 186, as discussed in further detail below with reference to FIGS. 9 and 10.

Still referring to FIG. 4, the power converter 178 may also distribute the output power 180 to a power controller 188. As will be described in more detail below, the power controller 188 controls whether the output power 180 is distributed to an output power port 190 to be distributed to power-consuming DAS devices electrically coupled to the output power port 190. The output power port 190 is electrically coupled to an output power connector 192 through the connectors 172, 174, as illustrated in FIG. 4. Thus, the output power 180 can be distributed to power-consuming DAS devices by electrical coupling to the output power connector 192 in the power distribution module 160. The power controller 188 contains a power enable port 194 and selectively distributes the output power 180 to the output power port 190 based on a power enable signal 196 provided on a power enable line 198 coupled to the power enable port 194. The power controller 188 is thus configured to distribute the output power 180 to the output power port 190 if the power enable signal 196 communicated on the power enable line 198 indicates to activate power. Activation of power means providing the output power 180 to the output power port 190 to be distributed to power-consuming DAS devices electrically coupled to the output power port 190. When output power 180 is activated and supplied to the output power connector 192, the output power 180 may also be coupled to a light to signify that output power 180 is active at the output power connector 192. The power controller 188 is also configured to not distribute the output power 180 to the output power port 190 if the power enable signal 196 communicated on the power enable line 198 indicates to deactivate power.

With continuing reference to FIG. 4, one source of the power enable signal 196 is the power disable/enable feature 202. The power enable/disable feature 202 closes a circuit on the power enable line 198 when an output power connector 204 is connected to the output power connector 192 of the power distribution module 160. When connected, the output power connector 204 will then be electrically coupled to the connector 174 of the power distribution module 160 which is connected to the midplane interface connector 172 of the power unit 162 when the power distribution module 160 is installed. The power enable/disable feature 202 may only be configured to close the circuit on the power enable line 198 until all other conductors of the output power connector 204 coupled to the output power connector 192 are fully electrically coupled to the midplane interface connector 172 via the connector 174. In this manner, electrical arcing between the output power connector 204 and the output power connector 192 may be avoided, because the power controller 188 does not provide output power 180 to the output power port 190 and the output power connector 192 until complete electrical coupling is established between the output power connector 204 and the output power connector 192. If the output power 180 was being provided to the output power port 190 before a complete electrical connection was made between the output power connector 192 and the output power connector 204, electrical arcing and/or electrical conductor corrosion may occur. Electrical arcing may occur during disconnection of the output power connector 204 from the output power connector 192 due to the output power 180 being "hot" and being actively supplied to the output power connector 192. The power controller 188 herein allows an output power connector 204 to be disconnected from the output power connector 192 while the input power 170 is "hot" or active, because the power enable/disable feature 202 is configured to open the circuit to the power enable line 198 to cause the power controller 188 to not provide the output power 180 to the output power port 190 before the electrical contact is decoupled between the output power connector 204 and the output power connector 192.

The power distribution module 160 is also configured to activate and deactivate providing output power 180 to the output power connector 192 upon installation (i.e., connection) or removal (i.e., disconnection) of the power distribution module 160 from the power unit 162. More specifically, the power enable/disable feature 202 is configured to only close the circuit on the power enable line 198 to enable the power controller 188 to provide output power 180 until all other conductors of the connector 174 of the power distribution module 160 are completely coupled to the midplane interface connector 172 during installation of the power distribution module 160 in the power unit 162. In this manner, electrical arcing between the output power connector 204 and the output power connector 192 may be avoided when the power distribution module 160 is installed in the power unit 162 when input power 170 is "hot." The internal components of the power distribution module 160 in FIG. 4 and the power unit 162 may be as shown in PCT Application No. PCT/US11/61761.

Figure 5:
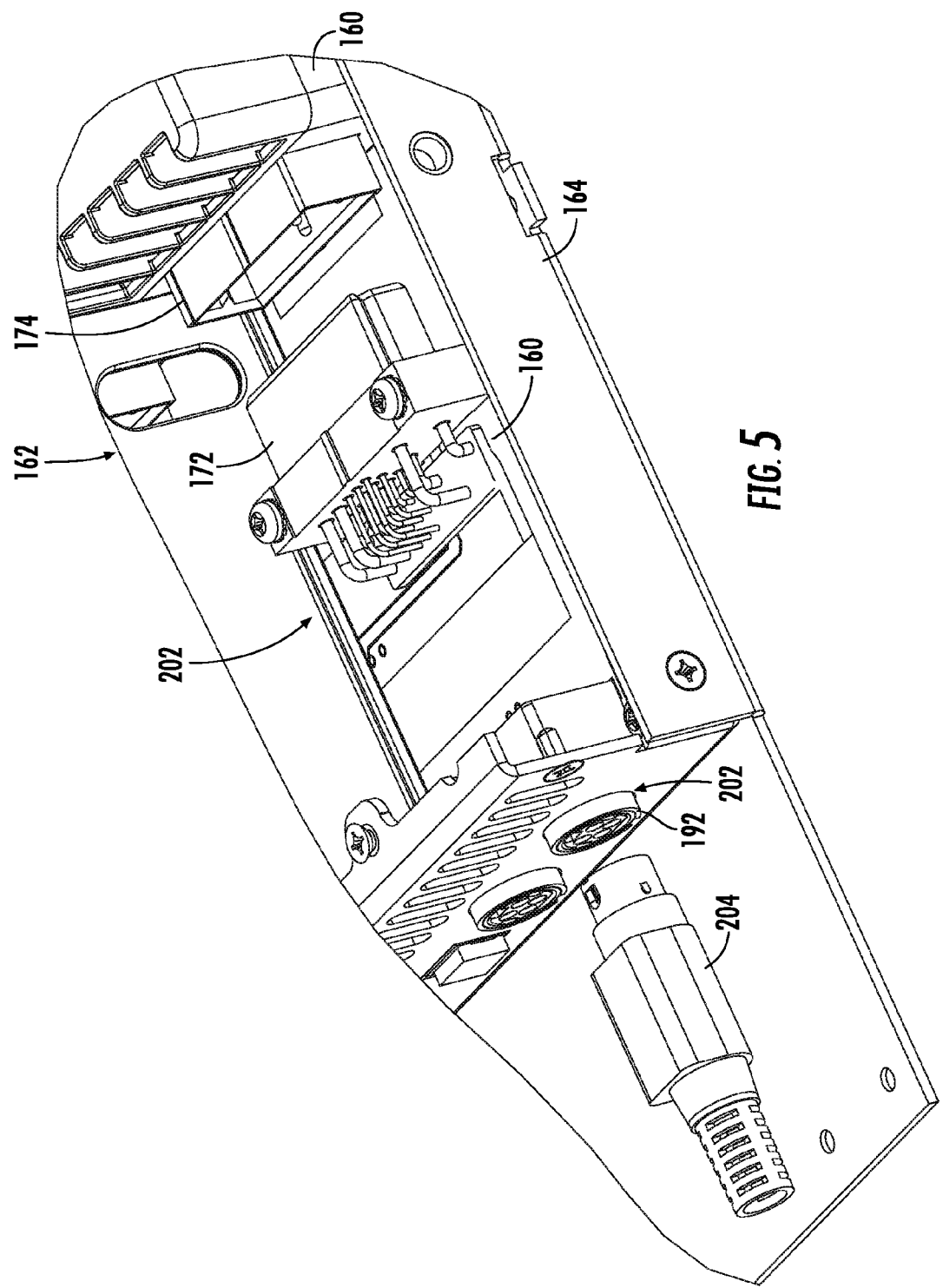
FIG. 5 is a side perspective view of an input power connector in the module of FIG. 4, and an output power connector of a power cable configured to be inserted into an output power connector in the power distribution module of FIG. 4.
Figure 6:
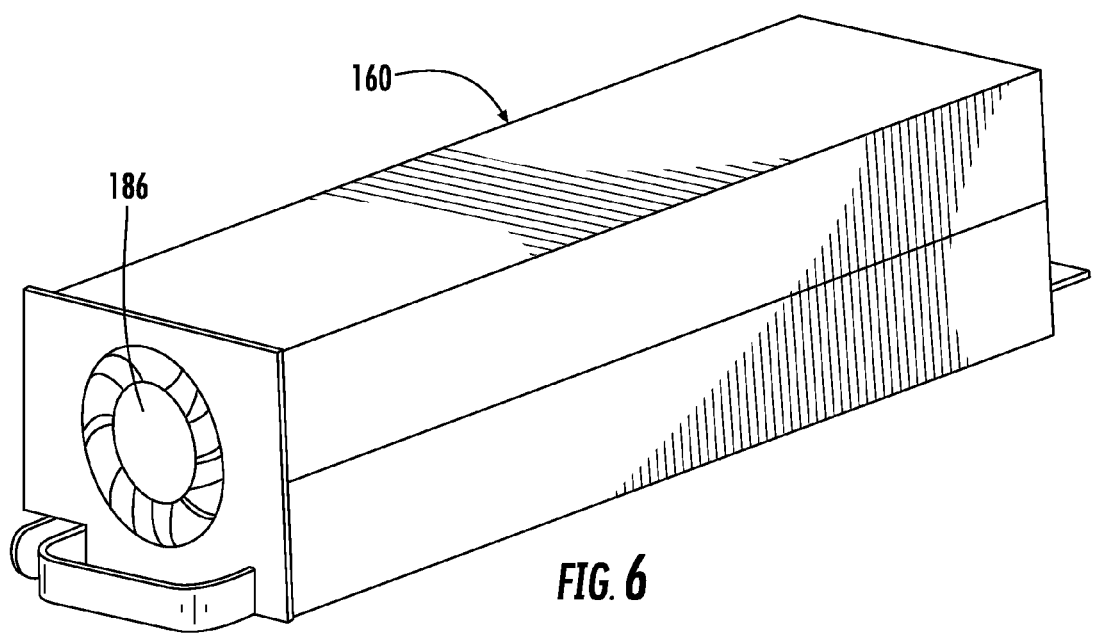
FIG. 6 illustrates a front, side perspective view of an exemplary power distribution module with a cover installed.

FIG. 5 is a side perspective view of an output power connector 204 being connected to the output power connector 192 of the power distribution module 160. FIG. 5 also shows the connector 174 of power distribution module 160 about to be inserted into the midplane interface connector 172 of the power unit 162 to couple input power 170 to the power distribution module 160 to be distributed through the output power connector 192 to the output power connector 204 to least one power-consuming DAS device. FIG. 6 illustrates a front, side perspective view of an exemplary power distribution module 160 with a cover installed. The power converter 178 can be provided to produce any voltage level of DC power desired. In one embodiment, the power converter 178 can produce relatively low voltage DC current. A low voltage may be desired that is power-limited and Safety Extra Low Voltage (SELV) compliant, although such is not required.

Figure 7:
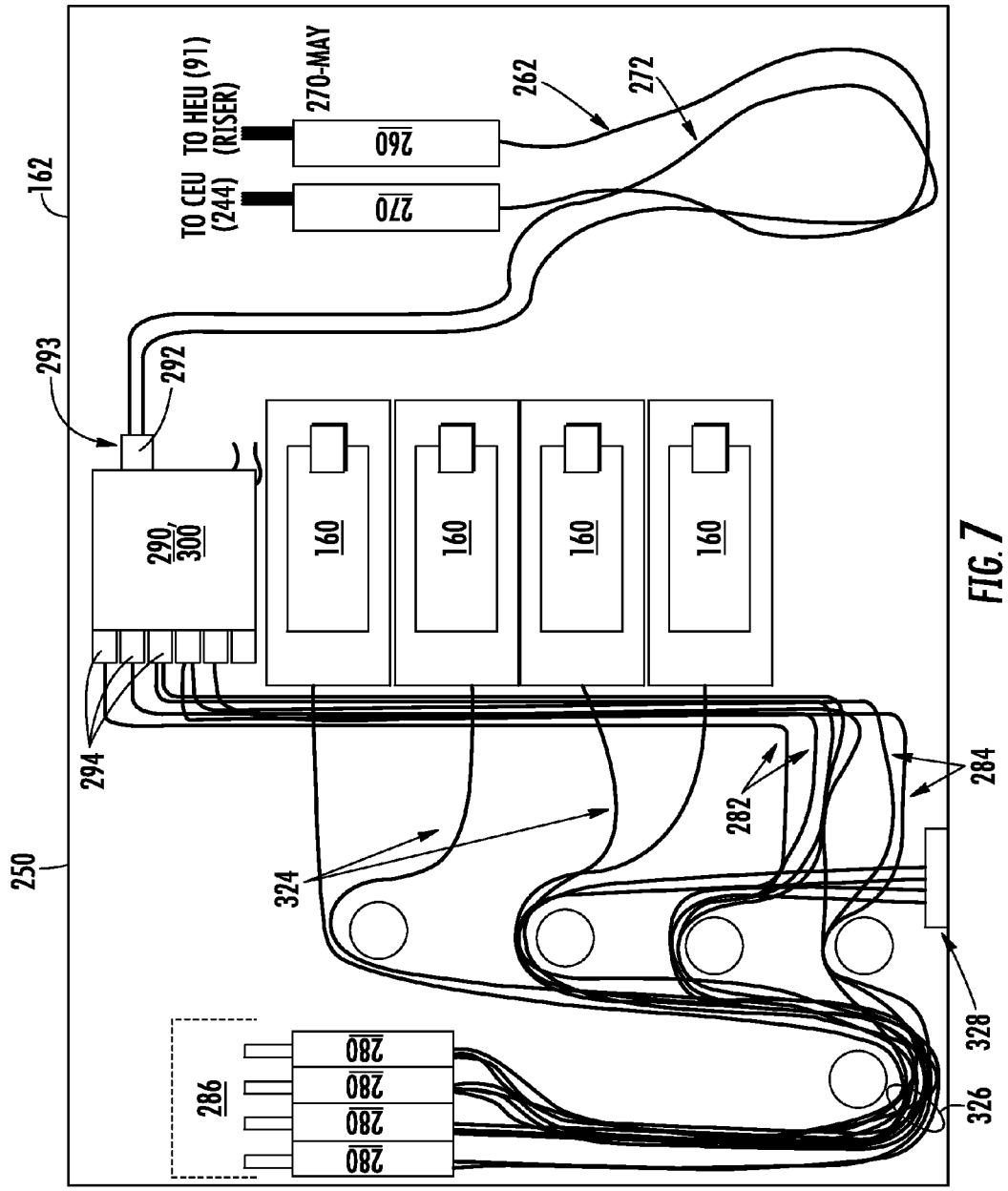
FIG. 7 is a schematic diagram of an exemplary power unit configured to support one or more power distribution modules to provide power to RAUs in a distributed antenna system.

As illustrated in FIG. 7, the power unit 162 (or, interconnect unit) may be provided in an enclosure 250. One or more power units 162 can be located on a floor of an office building, a multiple dwelling unit, etc. to provide power and connectivity to remote units on that floor. The exemplary power unit 162 is intended as a 1U rack mount configuration, although the power unit 162 may also be configured as a 3U version, for example, to accommodate additional remote units. A furcation 260, located inside the enclosure 250, of the riser cable 84 (e.g., FIG. 3A) breaks pairs of optical fibers from the riser cable 84 that are connected at an uplink end to the HEU 91, to provide optical communication input links to the HEU 91. The furcation 260 can be a Size 2 Edge™ Plug furcation, Part 02-013966-001 available from Corning Cable Systems LLC of Hickory N.C. If the CEU 244 is located with the HEU 91, optical fibers connecting the CEU 244 to the power unit 162 can be included in the riser cable 84. A furcation 270 breaks fiber pairs from the CEU 244 to provide optical communication input links to the CEU 244. The furcation 270 can be a Size 2 Edge™ Plug furcation, Part 02-013966-001 available from Corning Cable Systems LLC.

The optical communication input links from the HEU 91 and the CEU 244 are downlink and uplink optical fiber pairs to be connected to the remote units. In this embodiment, the furcated leg contains eight (8) optical fiber pairs to provide connections from the CEU 244 and HEU 91 to up to four (4) remote units, although any number of fibers and remote units can be used. The legs are connected to the power unit 162 at furcations 280, which can be arranged as two rows of four 2-fiber connectors on one face of the enclosure 250. The illustrated furcations 280 are internally mounted in the enclosure 250, but can also mounted on a tray 286 secured to the enclosure 250.

For communication between the HEU 91 and the remote units, the furcated leg 262 from the furcation 260 can be pre-connectorized with a fiber-optic connector to facilitate easy connection to a first adapter module 290 within the power unit 162. The first adapter module 290 includes a multi-fiber connector 292 that receives the connector of the furcated leg 262. The connector 292 can be, for example, a 12-fiber MTP connector. A series of six 2-fiber connectors 294, for example, at the other side of the first adapter module 290, connects to fiber pairs 282 from each furcation 280. Each fiber pair 282 can be connectorized with a 2-fiber connector that connects to one of six connectors 294 of the first adapter module 290. In this arrangement, the first adapter module 290 has the capacity to receive twelve fibers at the connector 292, and six separate connectorized fiber pairs 282. This exemplary arrangement allows for optical communication between six remote units and the HEU 91, although only four such connections are shown. The first adapter module 290 can be, for example, a 12/F LC EDGE™ Module/07-016841 for riser connection available from Corning Cable Systems LLC.

The furcated leg 272 from the furcation 270 can be pre-connectorized with a fiber-optic connector to facilitate easy connection to a second adapter module 300 within the power unit 162. In the illustrated embodiment, the second adapter module 300 is directly beneath the first adapter module 290, and thus is not visible in FIG. 7. The second adapter module 300 includes a multi-fiber connector 293 that receives the connector of the leg 272. The connector 293 can be, for example, a 12-fiber MTP connector. A series of six 2-fiber connectors, for example, at the other side of the second adapter module 300, connects to fiber pairs 284 from each furcation 280. Each fiber pair 284 can be connectorized with a 2-fiber connector that connects to one of six connectors of the second adapter module 300. In this arrangement, the second adapter module 300 has the capacity to receive twelve fibers at the connector 293, and six separate connectorized fiber pairs 284. This arrangement allows for optical communication between, for example, six Ethernet modules that are collocated or within respective remote units, and the CEU 244, although only four such connections are shown in the illustrated embodiment. The second adapter module 300 can be, for example, a 12/F LC EDGE™ Module/07-016841 for riser connection available from Corning Cable Systems LLC.

One or more power distribution modules 160 can be included in the enclosure 250 of the power unit 162. According to one embodiment, one power distribution module 160 can be connected to each remote unit by a pair of electrical conductors. Electrical conductors include, for example, coaxial cable and twisted copper conductor pairs. Each power distribution module 160 is shown connected to a twisted pair of conductors 324. The modules 160 plug into a back plane and the conductors that power the remote units connect to the back plane with a separate electrical connector from the optical fibers, although hybrid optical/electrical connectors could be used. Each cable extending to remote units can include two fibers and two twisted copper conductor pairs. One power distribution module 160 can be assigned to each remote unit, based upon power requirements. If an add-on module, such as an Ethernet module, is included at a remote unit, a second power distribution module 160 can be assigned to power the add-on module. The allocation of power and optical connectivity is accordingly adaptable depending upon the number and power requirements of remote units, additional modules, and hardware, etc. The modules 160 can be connected to a power bus that receives local power at the power unit 162 location.

Figure 8:
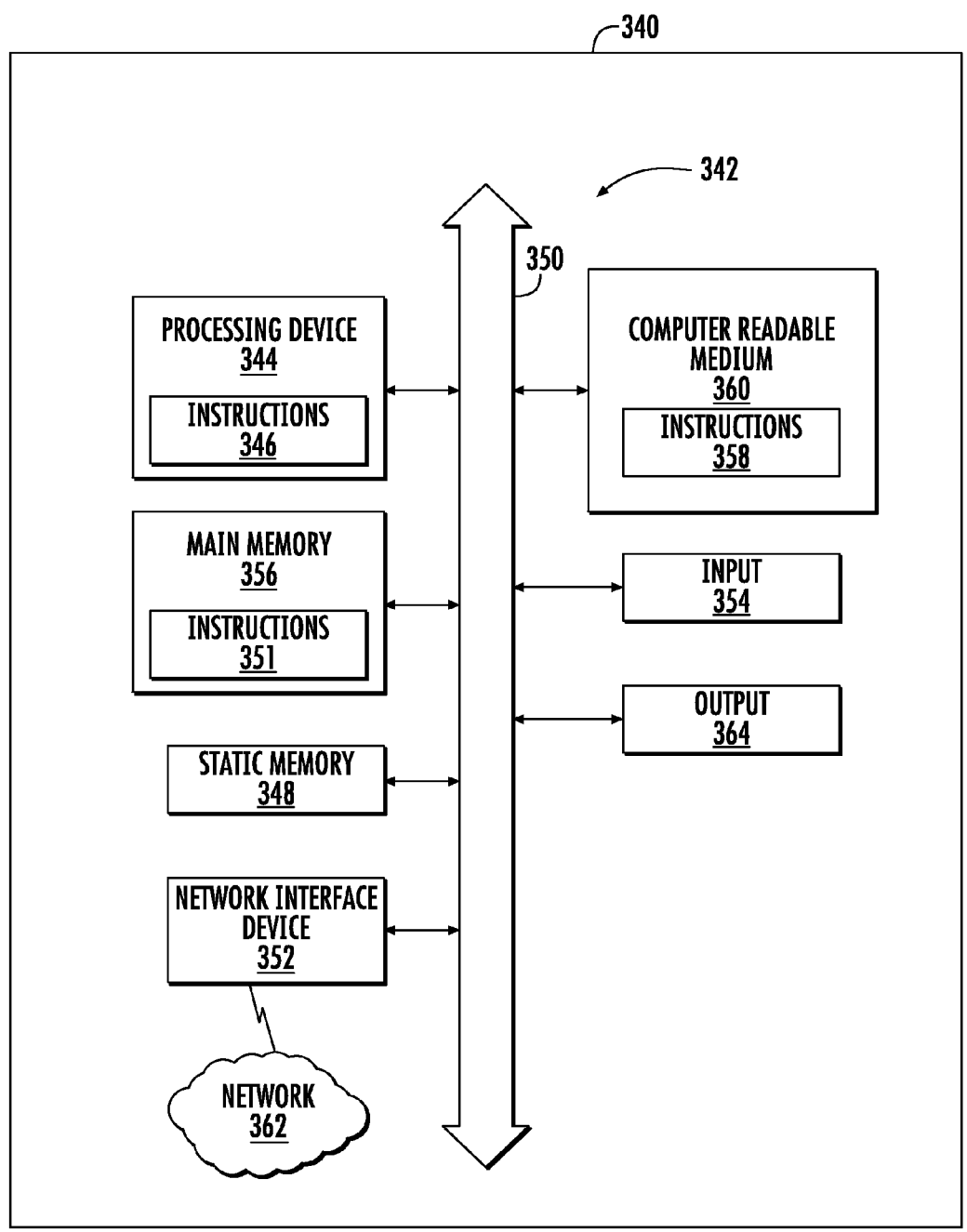
FIG. 8 is a schematic diagram of a computer system that can be included in the power distribution modules disclosed herein.

FIG. 8 is a schematic diagram of an exemplary computer system 340 that may be included in the power distribution module 160 and provided in the power controller 188. The computer system 340 is adapted to execute instructions from an exemplary computer-readable medium to perform power management functions. The computer system 400 may include a set of instructions for causing the power controller 188 to enable and disable coupling of power to the output power port 190, as previously described. The power controller 188 may be connected (e.g., networked) to other machines in a LAN, an intranet, an extranet, or the Internet. The power controller 188 may operate in a client-server network environment, or as a peer machine in a peer-to-peer (or distributed) network environment. The computer system 340 of the power controller 188 includes a processing device or processor 344, a main memory 356 and a static memory 348, which may communicate with each other via the data bus 350. Alternatively, the processing device 344 may be connected to the main memory 356 and/or static memory 348 directly or via some other connectivity means. The processing device 344 represents one or more general-purpose processing devices configured to execute processing logic in instructions 346 for performing the operations and steps discussed herein. The computer system 340 may further include a network interface device 352 and an input 354 to receive input and selections to be communicated to the computer system 340 when executing instructions. The computer system 340 may include a data storage device that includes instructions 358 stored in a computer-readable medium 360. The instructions 358 may also reside, completely or at least partially, within the main memory 356 and/or within the processing device 344 during execution thereof by the computer system 340, the main memory 356 and the processing device 344 also constituting computer-readable medium. The instructions 358 may further be transmitted or received over a network 362 via the network interface device 352.

Figure 9:
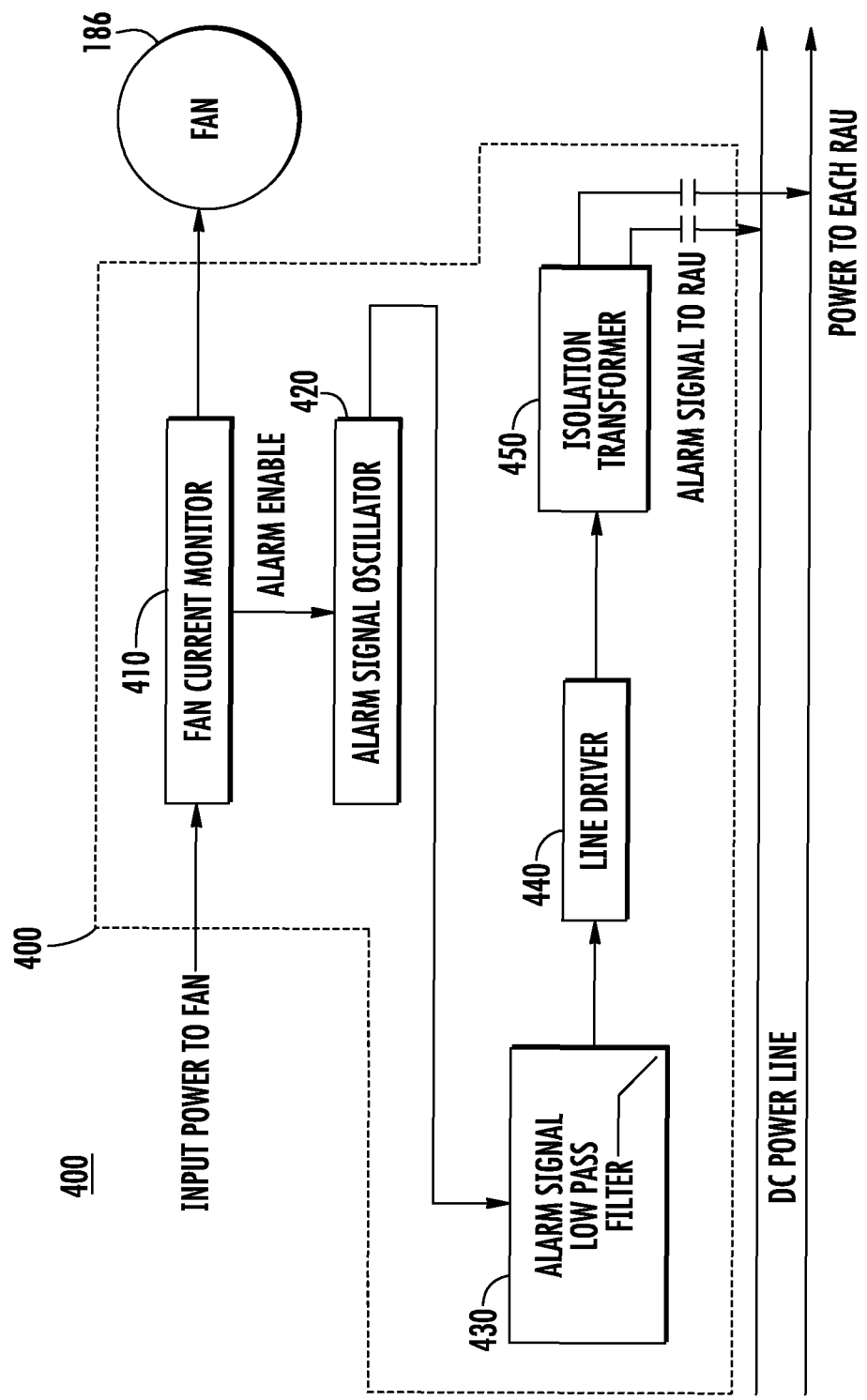
FIG. 9 is a schematic of a monitoring circuit that is suitable to provide monitoring for a fan used to cool a power module.

As previously discussed, the power distribution modules 160 may each include a fan 186 that is powered by the module 160, and each power module 85 (or 'interconnect unit') can include a plurality of power distribution modules 160 for powering RAUs 14. FIG. 9 is a schematic of a monitoring circuit 400 that is suitable to provide monitoring for the fans used to cool a power module, or to monitor cooling elements used to cool other components of a distributed antenna system. The circuit 400 can be, for example, suitable for monitoring the performance of the fans 186 in the power distribution modules 160 illustrated in FIG. 4. According to one exemplary embodiment, the monitoring circuit 400 can be located between the power converter 182 and the cooling fan 186. Although the power distribution modules 160 are disclosed as having processing capabilities, such as through a computer system as shown in FIG. 8, the cooling system monitoring and control components and method disclosed herein do not require processing capabilities within the power module.

Referring to FIG. 9, and also to FIG. 4, the circuit 400 receives power through one or more power converters at a fan current monitor 410. The fan current monitor 410 measures the current drawn by the fan 186 as it cools its module 160. Conventional fans include controllers that increase current draw in the event of fan wear, so as to maintain constant fan speed and accordingly constant cooling performance. A high current draw is thus indicative of wear on the fan 186, such as when the fan bearings become worn. The fans according to the present embodiments can include the conventional functionality of increasing current draw as a response to degradation in fan performance such as through wear. When the fan current monitor 410 detects a current draw above a specified threshold, it generates an Alarm Enable signal that is forwarded to an alarm signal oscillator 420. The Alarm Enable signal can be generated when the fan current exceeds an established threshold value, such as, for example, 10% or more above the nominal power usage value, or a higher threshold, such as 20% or more above nominal.

The alarm signal oscillator 420 generates a reference tone that is provided to a low pass filter 430 that removes unwanted harmonic frequencies from the reference tone generated by the alarm signal oscillator 420. The alarm signal oscillator 420 can generate, for example, a 1 MHz reference tone. The filtered reference tone signal from the low pass filter 430 drives an isolation transformer 450, which provides an Alarm Signal to an RAU coupled to the module 160.

The isolation transformer 450 can, for example, transmit the Alarm Signal over the electrically conductive cable, such as a twisted pair copper cable, used to provide power from the distribution module 160 to the RAU. The Alarm Signal can be transmitted over a frequency suitable for transmission over the medium connecting the power module to the RAU. For example, for CAT 5 cable and similar metallic conductor cables, the frequency of the Alarm Signal can be in the range of 500 Khz to 5 Mhz. The Alarm Signal can be, for example, a relatively simple reference tone of constant frequency, and no modulation.

The RAU connected to a conductor on which the Alarm Signal is transmitted is adapted to receive and recognize the Alarm Signal. The RAU can then provide a Fan Alarm Condition signal over an uplink communication path back to a central control location, such as head end equipment of a distributed antenna system. Referring also to FIG. 3B, in the exemplary distributed antenna system 10, an 'all-optical' optical uplink communication path extends from an RAU 14, through the power distribution module 160, and back to the HEE 12. The uplink communication path may alternatively comprise electrical communication media, or a combination of optical and electrical communication media. The Alarm Signal can be, for example, converted from a tone to a system alarm code indicating the Fan Alarm Condition. The Fan Alarm Condition can be sent over the uplink path to the HEE 12 via a control channel, transmitted as another code in the uplink communications protocol.

When the HEE 12 receives a Fan Alarm Condition signal from an RAU 14, the status of the fan corresponding to the RAU sending the signal may then be monitored for replacement, repair, or other servicing. The HEE 12 may be connected (e.g., networked) to a LAN, an intranet, an extranet, or the Internet. The fan status can thus be remotely monitored. The Fan Alarm Condition signal from the RAU 14 can be transmitted over a control channel separate from the RF transmissions to the HEE 12. According to one embodiment, the Fan Alarm Condition signal can be a 1 MHz signal on a control channel.

Referring also to FIG. 7, each power distribution module 160 can include a monitoring circuit 400 for monitoring an RAU or RAUs coupled to the module 160. The HEE 12 can identify the power distribution module 160 by, for example, the identity of the RAU sending the Alarm Signal to the HEE 12. In this manner, an RAU is responsible to report to the HEE 12 the status of the module 160 from which it is powered. Alternatively, the Alarm Signal can be encoded with an identifying indicia of the potentially faulty fan. Corrective action can thus be directed to the fan that may be on the verge of failure, or that may detract from system performance due to its excessive current draw from the power distribution module 160. Alternatively, a single circuit may monitor power usage of multiple fans in a power unit 162. If fan power consumption is measured as an aggregation, however, more diagnostic work may be required determine which fan among an aggregation of fans is outside of its predetermined operating parameters.

Figure 10:
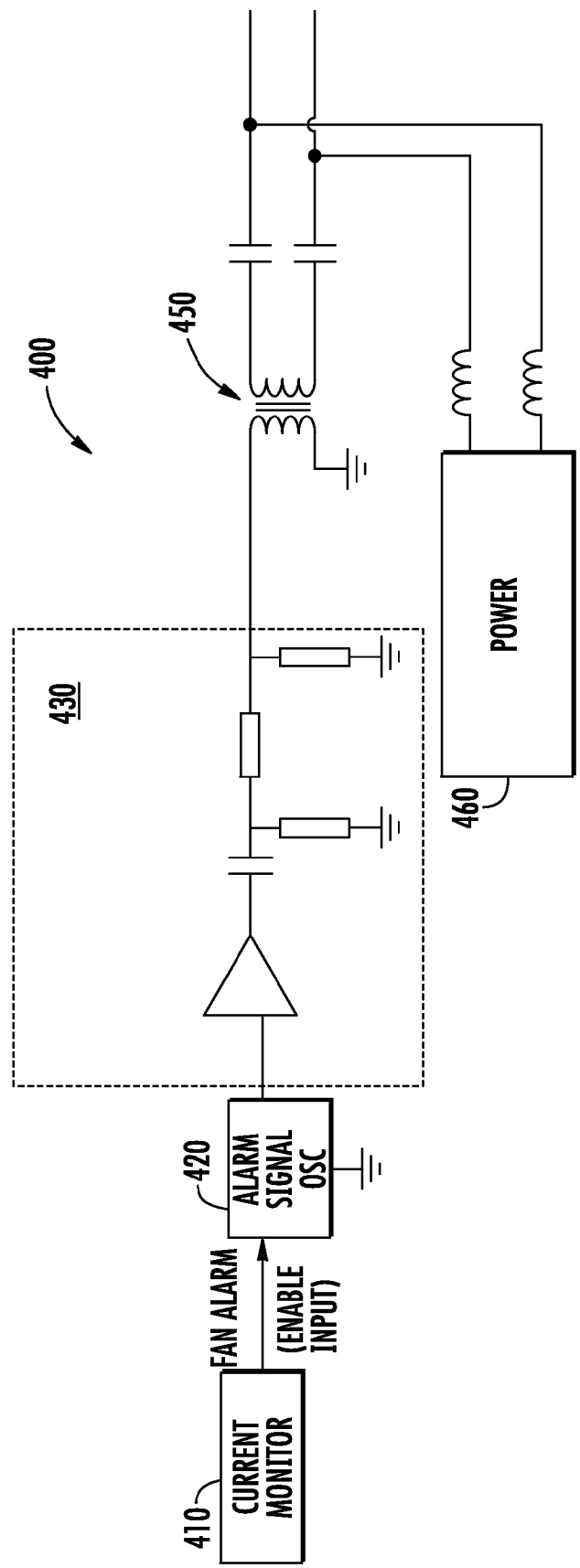
FIG. 10 is a detailed schematic of the fan monitoring circuit.

FIG. 10 is a detailed schematic of the monitoring circuit 400. FIG. 10 illustrates the electronic components of an exemplary embodiment of the low pass filter 430, a line driver 440, and of an exemplary embodiment of the isolation transformer 450. The power source is shown as component 460, and may correspond to the power converter 182 in FIG. 4, or more, generally, to the power converter 182 and additional power conditioning and/or generating circuitry.

In this specification, the fan current monitor is shown conceptually as part of the monitoring circuit 400. It is understood that cooling fans of the type used in the power distribution modules may be equipped with a fan current monitor, and that the current monitor may be remote from one or more of the other components in the monitoring circuit.

As used herein, it is intended that terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like. The distributed antenna systems herein can include any type or number of communications mediums, including but not limited to electrical conductors, optical fiber, and air (i.e., wireless transmission).

While computer-readable medium may be shown in an exemplary embodiment as a single medium, the term "computer-readable medium" should be taken to include a single medium or multiple media (e.g., a centralized or distributed database, and/or associated caches and servers) that store the one or more sets of instructions. The term "computer-readable medium" shall also include any medium that is capable of storing, encoding or carrying a set of instructions for execution by the processing device and that cause the processing device to perform any one or more of the methodologies of the embodiments disclosed herein.

The embodiments disclosed herein include various steps. The steps of the embodiments disclosed herein may be performed by hardware components, software components, and combinations thereof.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein.

Unless specifically stated otherwise as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The algorithms and displays presented herein are not inherently related to any particular computer or other apparatus. In addition, the embodiments described herein are not described with reference to any particular programming language.

The various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art.

The operational steps described in any of the exemplary embodiments herein are described to provide examples and may be performed in numerous different sequences other than the illustrated sequences. Furthermore, operations described in a single operational step may actually be performed in a number of different steps.

The antenna arrangements may include any type of antenna desired, including but not limited to dipole, monopole, and slot antennas. The distributed antenna systems that employ the antenna arrangements disclosed herein could include any type or number of communications mediums, including but not limited to electrical conductors, optical fiber, and air (i.e., wireless transmission).

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A distributed communication system, comprising:
    head-end equipment configured to receive downlink communications services signals and to provide downlink optical communications services signals to be communicated over at least one optical communications services downlink;
    at least one remote unit coupled to receive downlink communications service signals from the head-end equipment, and further configured to communicate RF communications signals into a coverage area and to receive RF communication signals from the coverage area; and
    at least one power distribution module, the module comprising:
        at least one fan;
        at least one output power port configured to distribute output power to at least one of the remote units; and
        a monitoring circuit, wherein
        the monitoring circuit is configured to monitor a power usage of the at least one fan and to provide an alarm signal to the at least one remote unit when the power usage of the at least one fan is outside of predetermined operating parameters, wherein the fan is outside of predetermined operating parameters when its power usage is above a predetermined threshold.

2. The distributed communication system of claim 1, wherein the at least one remote unit comprises a plurality of remote units, and the distributed communication system is deployed on multiple floors of a building infrastructure, with the head-end equipment being located on a floor, and at least one of the remote units being located on at least three different floors.

3. The distributed communication system of claim 2, further comprising a plurality of power units, each power unit comprising a plurality of the power distribution modules and configured to provide electrical power to pluralities of the remote units.

4. The distributed communication system of claim 3, wherein each remote unit is coupled to one of the power units by at least one optical fiber to receive optical communications and at least one metallic electrical conductor to receive power.

5. The distributed communication system of claim 3, wherein at least one of the power units is located on at least three different floors.

6. The distributed communication system of claim 3, wherein the at least one remote unit transmits a fan alarm condition signal to the head-end equipment over an all-optical communications path in response to receiving an alarm signal.

7. A distributed communication system, comprising:
    head-end equipment configured to receive downlink communications services signals and to provide downlink optical communications services signals to be communicated over at least one optical communications services downlink;
    at least one remote unit coupled to receive downlink communications service signals from the head-end equipment, and further configured to communicate RF communications signals into a coverage area and to receive RF communication signals from the coverage area; and
    a plurality of power units, each power unit comprising a plurality of power distribution modules and configured to provide power to pluralities of the remote units, each power distribution module comprising:
        at least one cooling fan;
        at least one output power port configured to distribute output power to at least one remote unit; and
        a monitoring circuit, wherein
        the monitoring circuit is configured to monitor a power usage of the at least one fan and to provide an alarm signal when the power usage of the at least one fan is outside of predetermined operating parameters, and
        the distributed communication system is deployed on multiple floors of a building infrastructure, with the head-end equipment being located on a floor, and one of the power units being located on at least three different floors.

8. The distributed communication system of claim 7, wherein each remote unit is coupled to one of the power units by at least one optical fiber to receive optical communications and at least one metallic electrical conductor to receive power.

9. The distributed communication system of claim 8, wherein each of the remote units includes an antenna system capable of transmitting RF communications into and receiving RF communications from a coverage area.

10. A method of monitoring a distributed communication system deployed on multiple floors of a building infrastructure, the distributed communication system comprising head-end equipment configured to receive downlink communications services signals and to transmit downlink communications services over at least one communications services downlink, a plurality of remote units configured to receive downlink communications services signals from the head-end equipment and to transmit uplink communications services signals to the head-end equipment, and at least one power distribution module configured to distribute power to at least one of the remote units, the method comprising:
    monitoring a power usage of at least one cooling fan;

providing an alarm signal to at least one of the remote units when the power usage of the at least one fan is outside of predetermined operating parameters; and transmitting a fan alarm condition signal from the remote unit receiving the alarm signal to the head-end equipment, wherein a cooling fan is outside of predetermined operating parameters when its power usage is above a predetermined threshold.

11. The method of claim 10, wherein the remote units include an antenna system capable of transmitting RF communications into and receiving RF communications from a coverage area.

12. The method of claim 10, wherein the distributed communication system further comprising a plurality of power units, each power unit comprising a plurality of the power distribution modules and configured to provide electrical power to the remote units.

13. The method of claim 12, wherein each remote unit is coupled to one of the power units by at least one optical fiber to receive optical communications and at least one metallic electrical conductor to receive power, the remote unit transmitting the fan alarm condition signal over at least one of an electrical or an optical conductor.

* * * * *